(12) United States Patent
Matsumoto et al.

(10) Patent No.: US 12,557,482 B2
(45) Date of Patent: Feb. 17, 2026

(54) DISPLAY DEVICE

(71) Applicant: Magnolia White Corporation, Tokyo (JP)

(72) Inventors: Yuko Matsumoto, Tokyo (JP); Kimitaka Ohata, Tokyo (JP); Hiraaki Kokame, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 303 days.

(21) Appl. No.: 18/334,411

(22) Filed: Jun. 14, 2023

(65) Prior Publication Data

US 2023/0413612 A1 Dec. 21, 2023

(30) Foreign Application Priority Data

Jun. 15, 2022 (JP) ................. 2022-096615

(51) Int. Cl.
| | |
|---|---|
| *H10K 59/122* | (2023.01) |
| *H10K 59/12* | (2023.01) |
| *H10K 59/35* | (2023.01) |
| *H10K 59/80* | (2023.01) |

(52) U.S. Cl.
CPC ....... *H10K 59/122* (2023.02); *H10K 59/1201* (2023.02); *H10K 59/352* (2023.02); *H10K 59/873* (2023.02)

(58) Field of Classification Search
CPC ............... H10K 59/122; H10K 59/873; H10K 59/1201; H10K 59/352
See application file for complete search history.

(56) References Cited

U.S. PATENT DOCUMENTS

| | | | |
|---|---|---|---|
| 5,407,530 A | 4/1995 | Watanabe et al. | |
| 2004/0160170 A1 | 8/2004 | Sato et al. | |
| 2009/0009069 A1* | 1/2009 | Takata | H10K 59/122 445/24 |
| 2019/0363275 A1 | 11/2019 | Ochi et al. | |
| 2022/0077251 A1 | 3/2022 | Choung et al. | |
| 2023/0240126 A1* | 7/2023 | Mimura | H10K 59/122 438/99 |
| 2023/0345769 A1* | 10/2023 | Ishida | H10K 59/122 |

FOREIGN PATENT DOCUMENTS

| | | |
|---|---|---|
| JP | H06-215329 A | 8/1994 |
| JP | 2000-195677 A | 7/2000 |
| JP | 2004-207217 A | 7/2004 |
| JP | 2008-135325 A | 6/2008 |
| JP | 2009-32673 A | 2/2009 |
| JP | 2010-118191 A | 5/2010 |
| WO | 2018/179308 A1 | 10/2018 |

\* cited by examiner

*Primary Examiner* — Mariceli Santiago
(74) *Attorney, Agent, or Firm* — XSENSUS LLP

(57) ABSTRACT

According to one embodiment, a display device includes a rib including first to third pixel apertures, a partition which includes a lower portion on the rib and an upper portion protruding from a side surface of the lower portion, first to third display elements overlapping the first to third pixel apertures, first to third sealing layers including first to third portions on the upper portion. At least two of a first width of an area in which the first portion overlaps the upper portion, a second width of an area in which the second portion overlaps the upper portion and a third width of an area in which the third portion overlaps the upper portion are different from each other.

5 Claims, 28 Drawing Sheets

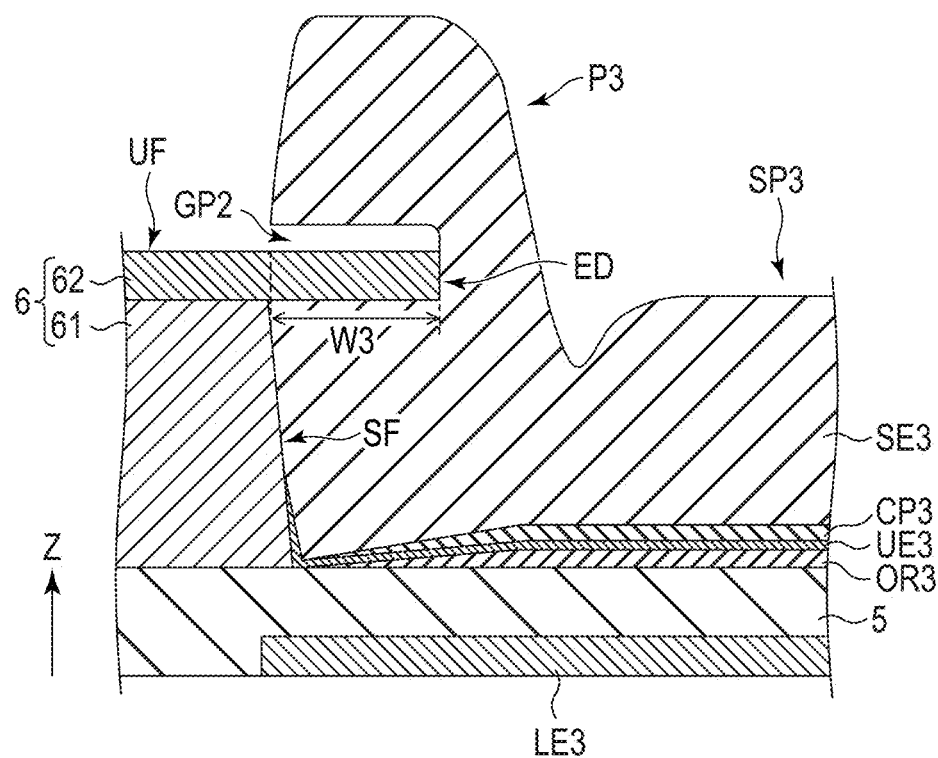
F I G. 6

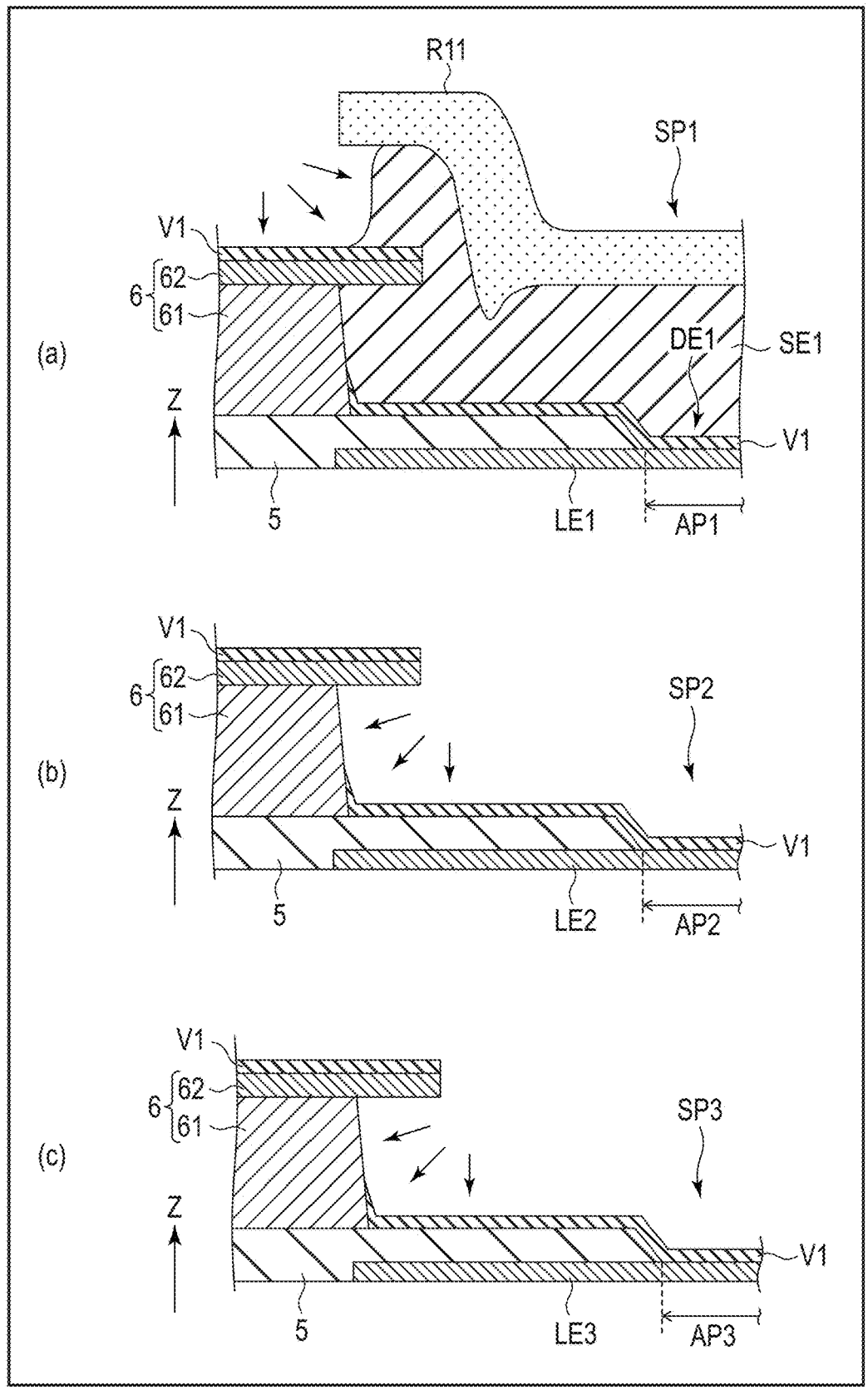
F I G. 10

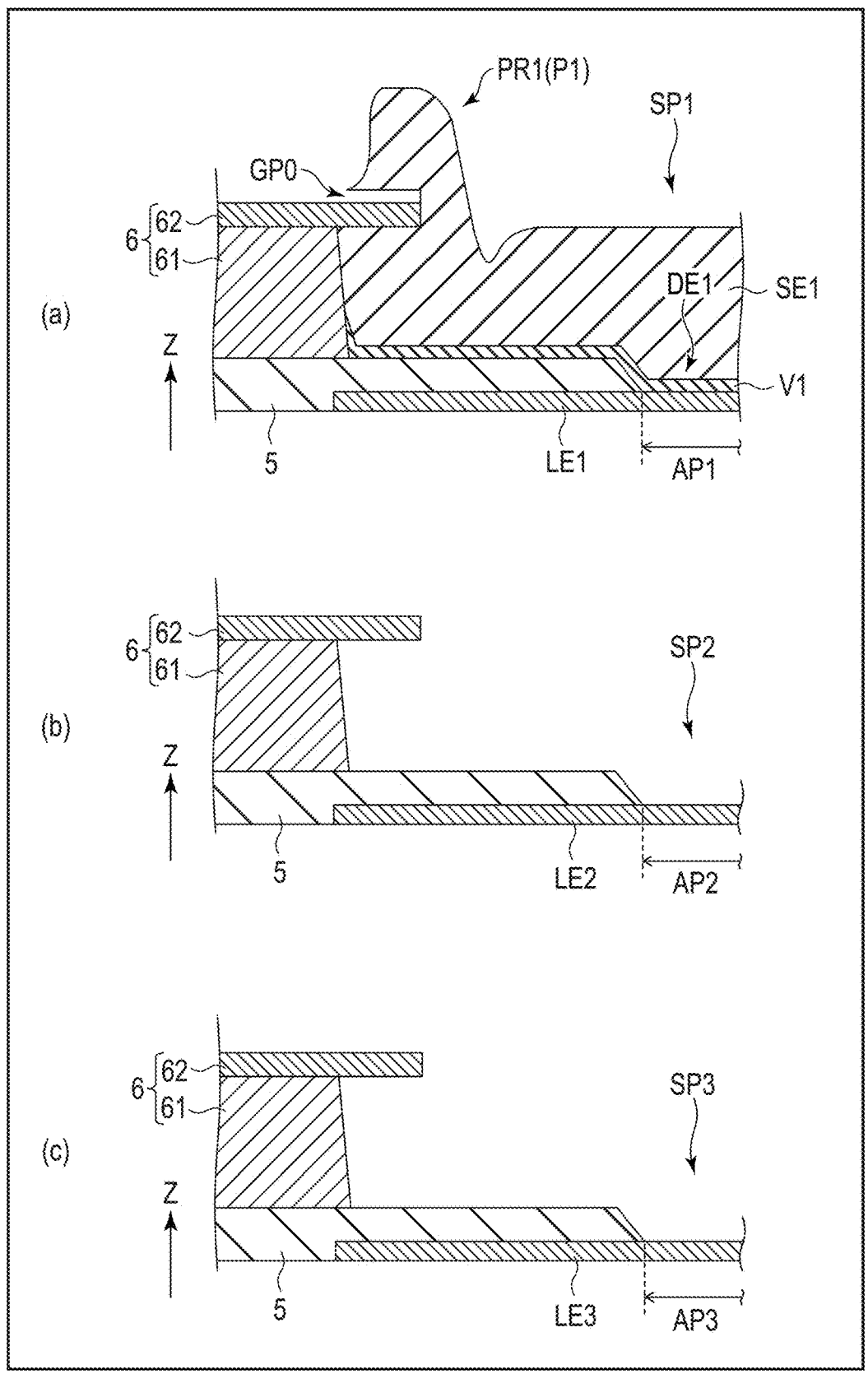
F I G. 11

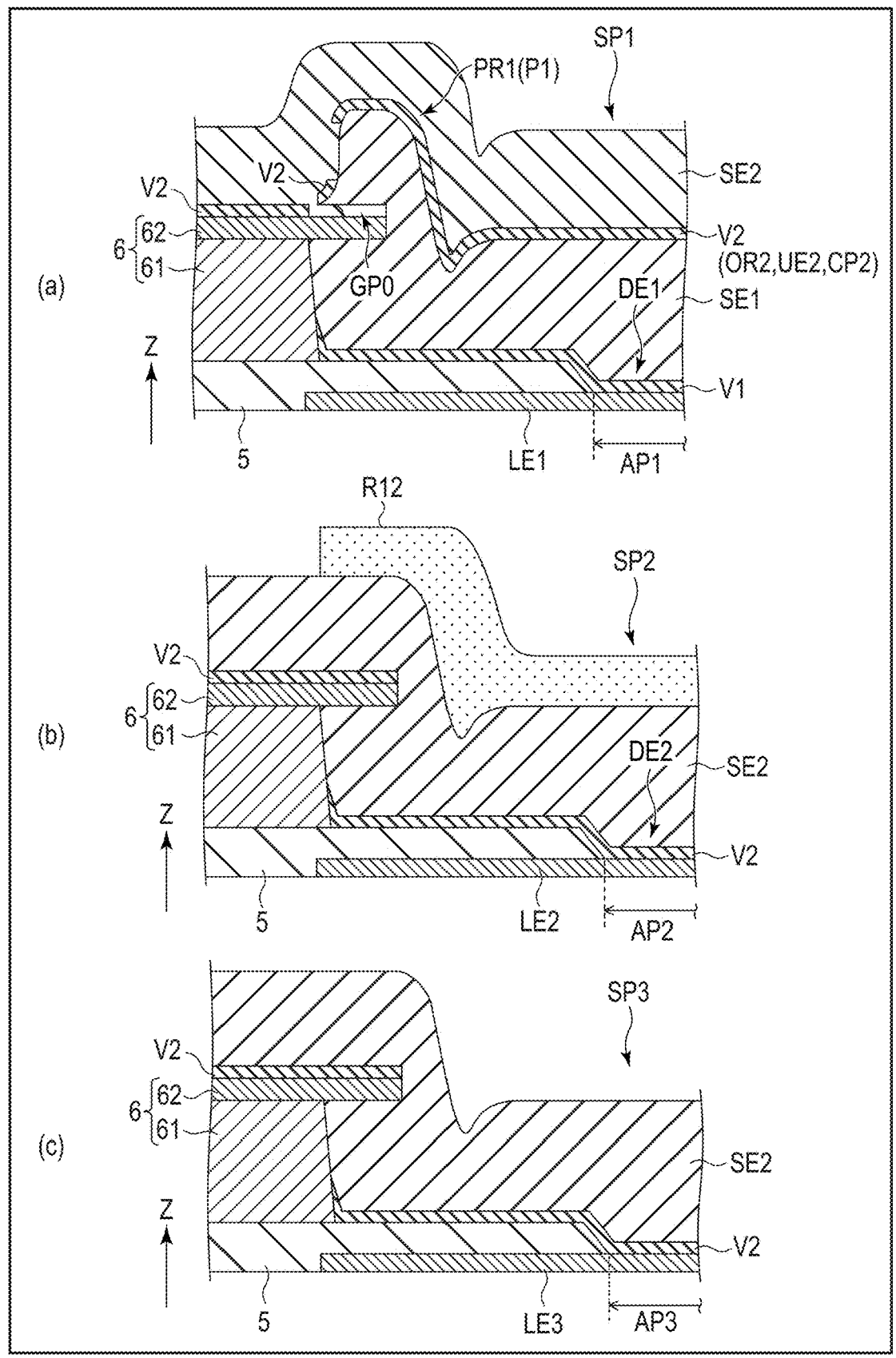
F I G. 12

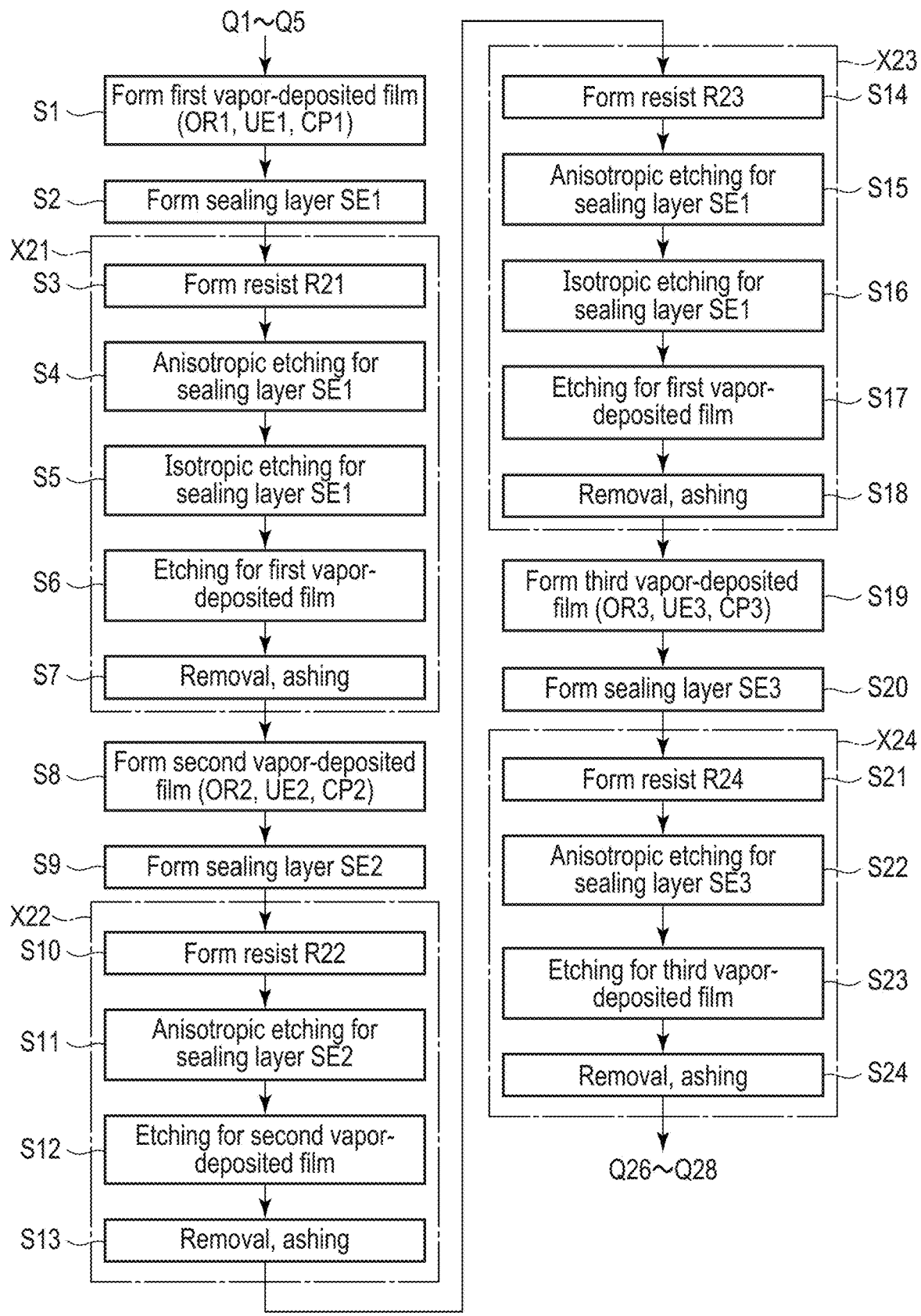
F I G. 21

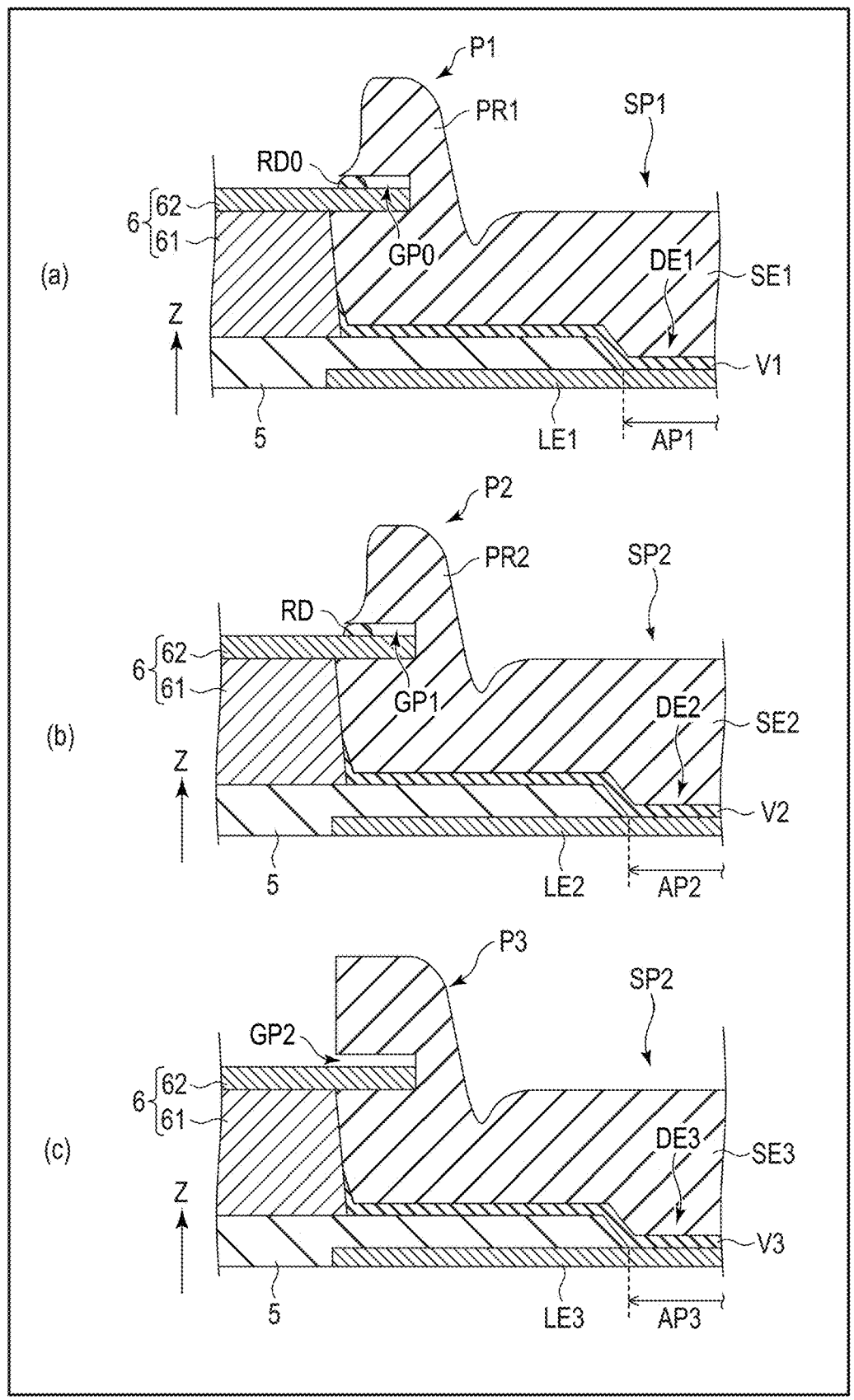
F I G. 30

DISPLAY DEVICE

CROSS-REFERENCE TO RELATED APPLICATIONS

This application is based upon and claims the benefit of priority from Japanese Patent Application No. 2022-096615, filed Jun. 15, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When such a display device is manufactured, a technique which improves the display quality and reliability is required.

BRIEF DESCRIPTION OF THE DRAWINGS

FIG. 6 is a schematic cross-sectional view showing the structure of the partition which surrounds a third subpixel and its vicinity.

FIG. 10 is a schematic cross-sectional view showing the process subsequent to FIG. 9.

FIG. 11 is a schematic cross-sectional view showing the process subsequent to FIG. 10.

FIG. 12 is a schematic cross-sectional view showing the process subsequent to FIG. 11.

FIG. 21 is a flowchart showing an example of the manufacturing method of a display device according to the second embodiment.

FIG. 30 is a schematic cross-sectional view showing the process subsequent to FIG. 29.

DETAILED DESCRIPTION

Figure 1:
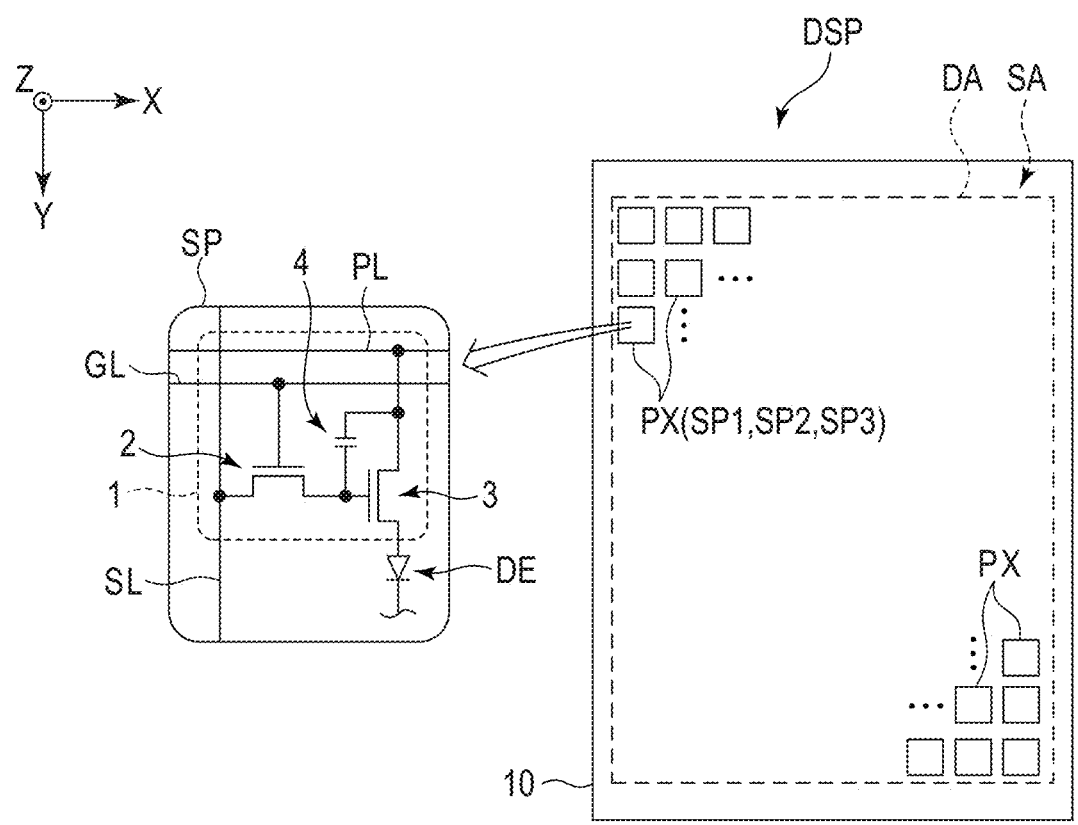
FIG. 1 is a diagram showing a configuration example of a display device according to a first embodiment.

In general, according to one embodiment, a display device comprises a rib, a partition, a first display element, a second display element, a third display element, a first sealing layer, a second sealing layer and a third sealing layer. The rib comprises a first pixel aperture, a second pixel aperture and a third pixel aperture. The partition includes a lower portion provided on the rib and an upper portion protruding from a side surface of the lower portion and surrounds the first pixel aperture, the second pixel aperture and the third pixel aperture. The first display element includes a first lower electrode, a first upper electrode and a first organic layer provided between the first lower electrode and the first upper electrode and overlaps the first pixel aperture. The second display element includes a second lower electrode, a second upper electrode and a second organic layer provided between the second lower electrode and the second upper electrode and overlaps the second pixel aperture. The third display element includes a third lower electrode, a third upper electrode and a third organic layer provided between the third lower electrode and the third upper electrode and overlaps the third pixel aperture. The first sealing layer covers the first display element and comprises a first portion located on the upper portion. The second sealing layer covers the second display element and comprises a second portion located on the upper portion. The third sealing layer covers the third display element and comprises a third portion located on the upper portion. Further, at least two of a first width of an area in which the first portion overlaps the upper portion, a second width of an area in which the second portion overlaps the upper portion and a third width of an area in which the third portion overlaps the upper portion are different from each other.

According to another aspect of the embodiment, a gap closed by the second portion and the upper portion is defined between the second portion and the upper portion.

According to the embodiment, a manufacturing method of a display device comprises forming a first lower electrode, a second lower electrode and a third lower electrode, forming a rib comprising a first pixel aperture overlapping the first lower electrode, a second pixel aperture overlapping the second lower electrode, and a third pixel aperture overlapping the third lower electrode, forming a partition which includes a lower portion provided on the rib and an upper portion protruding from a side surface of the lower portion, and surrounds the first pixel aperture, the second pixel aperture and the third pixel aperture, forming a first vapor-deposited film including a first organic layer which is in contact with the first lower electrode through the first pixel aperture and a first upper electrode which covers the first organic layer in an entire display area, forming a first sealing layer which covers the first vapor-deposited film in the entire display area, performing a first patterning process for, of the first sealing layer and the first vapor-deposited film, maintaining a portion located above the first lower electrode and removing a portion located above the second lower electrode and the third lower electrode, forming a second vapor-deposited film including a second organic layer which is in contact with the second lower electrode through the second pixel aperture and a second upper electrode which covers the second organic layer in the entire display area, forming a second sealing layer which covers the second vapor-deposited film in the entire display area, performing a second patterning process for, of the second sealing layer and the second vapor-deposited film, maintaining a portion located above the second lower electrode and removing a portion located above the first lower electrode and the third lower electrode, forming a third vapor-deposited film including a third organic layer which is in contact with the third lower electrode through the third pixel aperture and a third upper electrode which covers the third organic layer in the entire display area, forming a third sealing layer which covers the third vapor-deposited film in the entire display area, and performing a third patterning process for, of the third sealing layer and the third vapor-deposited film, maintaining a portion located above the third lower electrode and removing a portion located above the first lower electrode and the second lower electrode. The first patterning process includes anisotropic dry etching for the first sealing layer, and isotropic dry etching performed for the first sealing layer after the anisotropic dry etching. The third patterning process includes anisotropic dry etching for the third sealing layer and does not include isotropic dry etching for the third sealing layer.

According to another aspect of the embodiment, a manufacturing method of a display device comprises forming a first lower electrode, a second lower electrode and a third lower electrode, forming a rib comprising a first pixel aperture overlapping the first lower electrode, a second pixel aperture overlapping the second lower electrode and a third pixel aperture overlapping the third lower electrode, forming a partition which includes a lower portion provided on the rib and an upper portion protruding from a side surface of the lower portion, and surrounds the first pixel aperture, the second pixel aperture and the third pixel aperture, forming a first vapor-deposited film including a first organic layer which is in contact with the first lower electrode through the first pixel aperture and a first upper electrode which covers the first organic layer in an entire display area, forming a first sealing layer which covers the first vapor-deposited film in the entire display area, performing a first patterning process for, of the first sealing layer and the first vapor-deposited film, maintaining a portion located above the first lower electrode and the third lower electrode and removing a portion located above the second lower electrode, forming a second vapor-deposited film including a second organic layer which is in contact with the second lower electrode through the second pixel aperture and a second upper electrode which covers the second organic layer in the entire display area, forming a second sealing layer which covers the second vapor-deposited film in the entire display area, performing a second patterning process for, of the second sealing layer and the second vapor-deposited film, maintaining a portion located above the second lower electrode and removing a portion located above the first lower electrode and the third lower electrode, performing a third patterning process for, of the first sealing layer and the first vapor-deposited film, maintaining a portion located above the first lower electrode and removing a portion located above the third lower electrode after the second patterning process, forming a third vapor-deposited film including a third organic layer which is in contact with the third lower electrode through the third pixel aperture and a third upper electrode which covers the third organic layer in the entire display area, forming a third sealing layer which covers the third vapor-deposited film in the entire display area, and forming a fourth patterning process for, of the third sealing layer and the third vapor-deposited film, maintaining a portion located above the third lower electrode and removing a portion located above the first lower electrode and the second lower electrode. The first patterning process includes anisotropic dry etching for the first sealing layer and isotropic dry etching performed for the first sealing layer after the anisotropic dry etching. The fourth patterning process includes anisotropic dry etching for the third sealing layer and does not include isotropic dry etching for the third sealing layer.

The embodiments can improve the display quality or reliability of a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various elements are viewed parallel to the third direction Z, the appearance is defined as a plan view.

The display device of each embodiment is an organic electroluminescent display device comprising an organic light emitting diode (OLED) as a display element, and could be mounted on a television, a personal computer, a vehicle-mounted device, a tablet, a smartphone, a mobile phone, etc.

First Embodiment

FIG. 1 is a diagram showing a configuration example of a display device DSP according to a first embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a blue first subpixel SP1, a green second subpixel SP2 and a red third subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE. The display element DE is an organic light emitting diode (OLED) as a light emitting element.

It should be noted that the configuration of the pixel circuit 1 is not limited to the example shown in the figure. For example, the pixel circuit 1 may comprise more thin-film transistors and capacitors.

Figure 2:
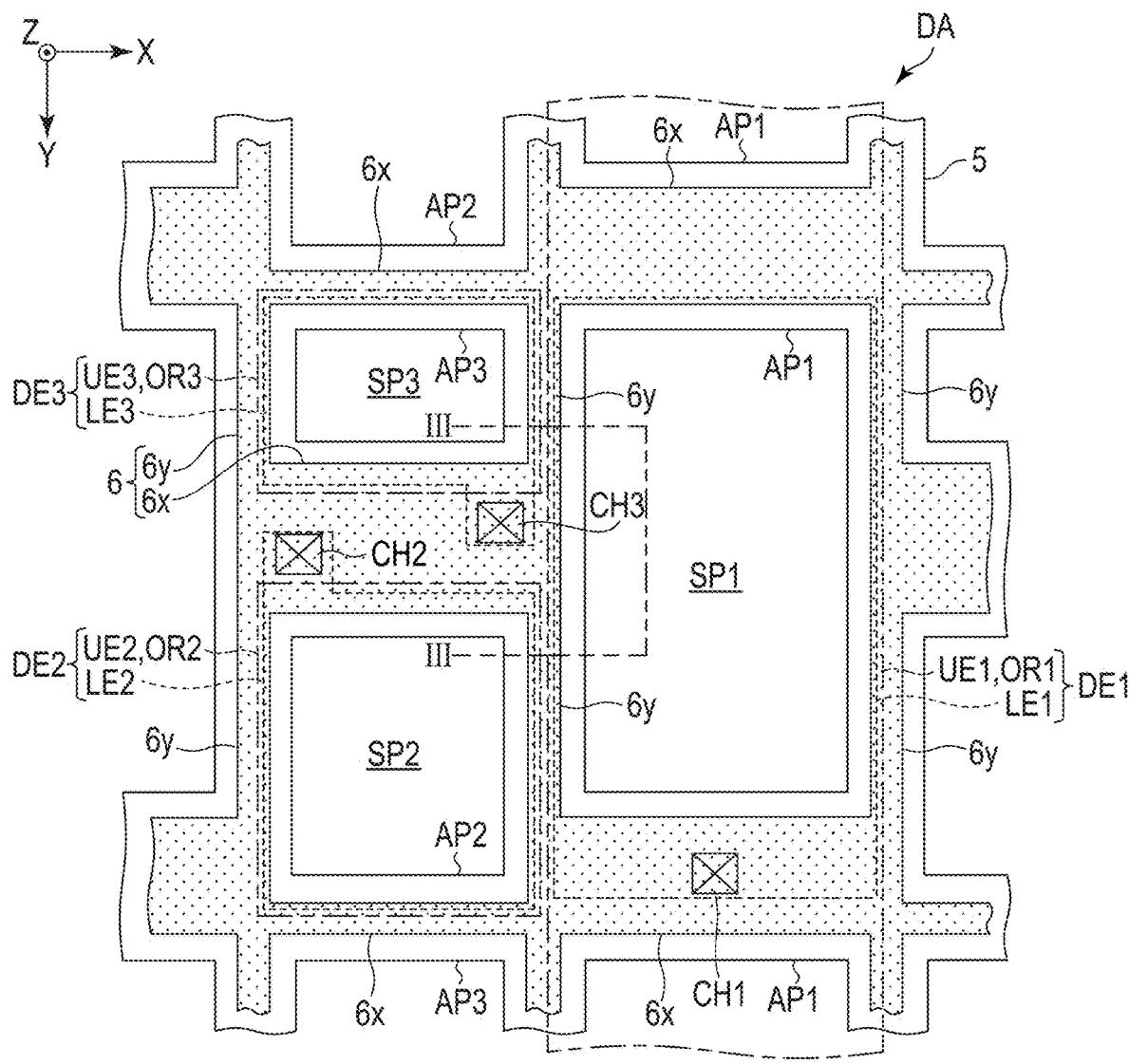
FIG. 2 is a diagram showing an example of the layout of subpixels.

FIG. 2 is a diagram showing an example of the layout of subpixels SP1, SP2 and SP3. In the example of FIG. 2, the first subpixel SP1 and the third subpixel SP3 are arranged in the first direction X. The first subpixel SP1 and the second subpixel SP2 are also arranged in the first direction X. Further, the second subpixel SP2 and the third subpixel SP3 are arranged in the second direction Y.

When subpixels SP1, SP2 and SP3 are provided in line with this layout, in the display area DA, a column in which subpixels SP2 and SP3 are alternately provided in the second direction Y and a column in which a plurality of first subpixels SP1 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises a first pixel aperture AP1 in the first subpixel SP1, comprises a second pixel aperture AP2 in the second subpixel SP2 and comprises a third pixel aperture AP3 in the third subpixel SP3.

In the example of FIG. 2, the area of the first pixel aperture AP1 is greater than that of the second pixel aperture AP2. The area of the first pixel aperture AP1 is greater than that of the third pixel aperture AP3. Further, the area of the third pixel aperture AP3 is less than that of the second pixel aperture AP2.

The partition 6 is provided in the boundary between adjacent subpixels SP and overlaps the rib 5 as seen in plan view. The partition 6 comprises a plurality of first partitions 6x extending in the first direction X and a plurality of second partitions 6y extending in the second direction Y. The first partitions 6x are provided between the pixel apertures AP2 and AP3 which are adjacent to each other in the second direction Y and between two first pixel apertures AP1 which are adjacent to each other in the second direction Y. Each second partition 6y is provided between the pixel apertures AP1 and AP2 which are adjacent to each other in the first direction X and between the pixel apertures AP1 and AP3 which are adjacent to each other in the first direction X.

In the example of FIG. 2, the first partitions 6x and the second partitions 6y are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

The first subpixel SP1 comprises a first lower electrode LE1, a first upper electrode UE1 and a first organic layer OR1 overlapping the first pixel aperture AP1. The second subpixel SP2 comprises a second lower electrode LE2, a second upper electrode UE2 and a second organic layer OR2 overlapping the second pixel aperture AP2. The third subpixel SP3 comprises a third lower electrode LE3, a third upper electrode UE3 and a third organic layer OR3 overlapping the third pixel aperture AP3.

The first lower electrode LE1, the first upper electrode UE1 and the first organic layer OR1 constitute the first display element DE1 of the first subpixel SP1. The second lower electrode LE2, the second upper electrode UE2 and the second organic layer OR2 constitute the second display element DE2 of the second subpixel SP2. The third lower electrode LE3, the third upper electrode UE3 and the third organic layer OR3 constitute the third display element DE3 of the third subpixel SP3. Each of the display elements DE1, DE2 and DE3 may include a cap layer (optical adjustment layer) as described later.

The first lower electrode LE1 is connected to the pixel circuit 1 (see FIG. 1) of the first subpixel SP1 through a first contact hole CH1. The second lower electrode LE2 is connected to the pixel circuit 1 of the second subpixel SP2 through a second contact hole CH2. The third lower electrode LE3 is connected to the pixel circuit 1 of the third subpixel SP3 through a third contact hole CH3.

In the example of FIG. 2, the contact holes CH2 and CH3 entirely overlap the first partition 6X between the pixel apertures AP2 and AP3 which are adjacent to each other in the second direction Y. The first contact hole CH1 entirely overlaps the first partition 6x between two first pixel apertures AP1 which are adjacent to each other in the second direction Y. As another example, at least part of the contact hole CH1, CH2 or CH3 may not overlap the first partition 6x.

Figure 3:
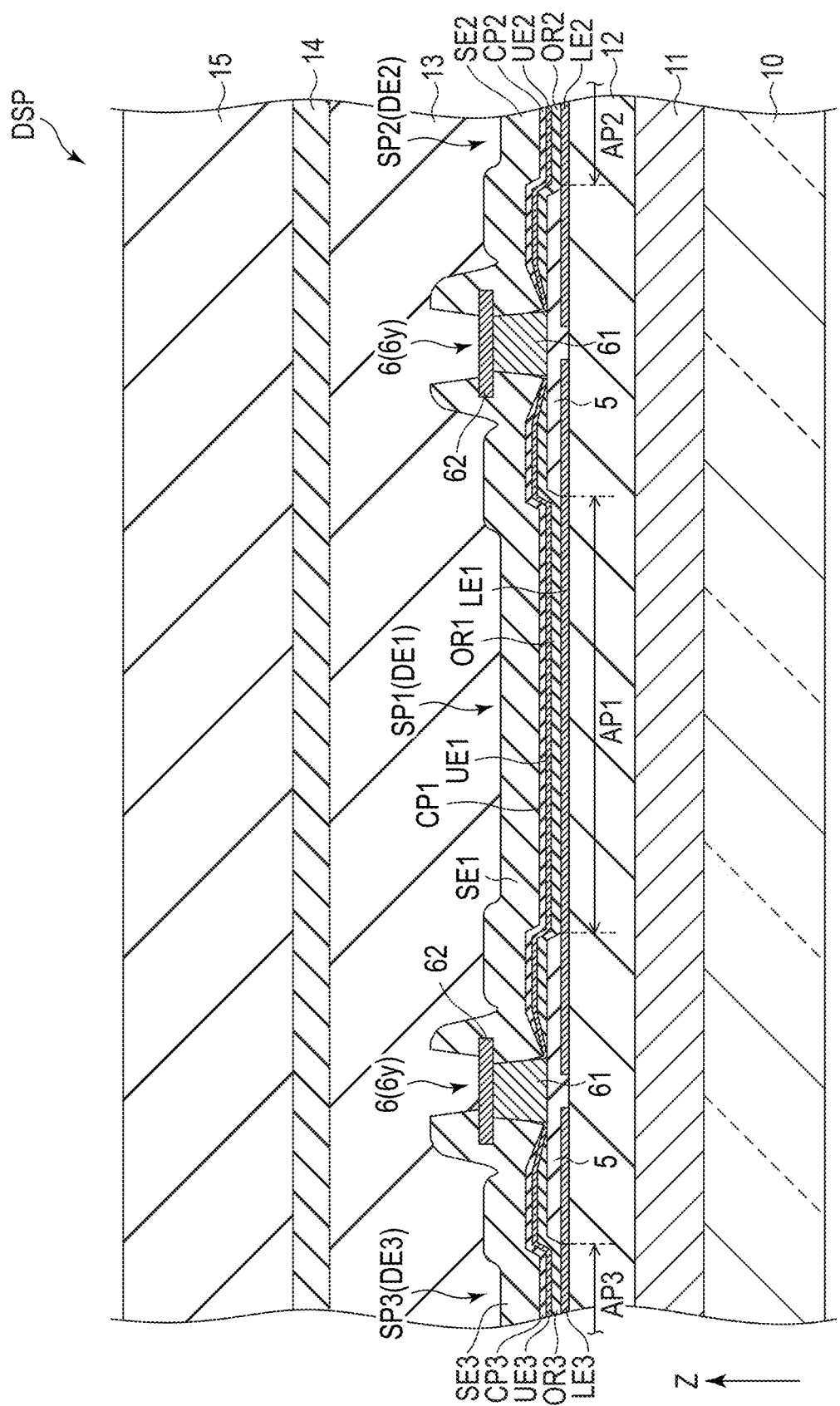
FIG. 3 is a schematic cross-sectional view of the display device along the III-III line of FIG. 2.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, all of the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 may be called an overhang shape.

The first organic layer OR1 covers the first lower electrode LE1 through the first pixel aperture AP1. The first upper electrode UE1 covers the first organic layer OR1 and faces the first lower electrode LE1. The second organic layer OR2 covers the second lower electrode LE2 through the second pixel aperture AP2. The second upper electrode UE2 covers the second organic layer OR2 and faces the second lower electrode LE2. The third organic layer OR3 covers the third lower electrode LE3 through the third pixel aperture AP3. The third upper electrode UE3 covers the third organic layer OR3 and faces the third lower electrode LE3.

In the example of FIG. 3, a first cap layer CP1 is provided on the first upper electrode UE1. A second cap layer CP2 is provided on the second upper electrode UE2. A third cap layer CP3 is provided on the third upper electrode UE3. The cap layers CP1, CP2 and CP3 adjust the optical property of the light emitted from the organic layers OR1, OR2 and OR3, respectively.

A first sealing layer SE1 is provided in the first subpixel SP1. A second sealing layer SE2 is provided in the second subpixel SP2. A third sealing layer SE3 is provided in the third subpixel SP3. The first sealing layer SE1 continuously covers the first cap layer CP1 and the partition 6 around the first subpixel SP1. The second sealing layer SE2 continuously covers the second cap layer CP2 and the partition 6 around the second subpixel SP2. The third sealing layer SE3 continuously covers the third cap layer CP3 and the partition 6 around the third subpixel SP3.

The end portions (peripheral portions) of the sealing layers SE1, SE2 and SE3 are located on the upper portions 62. In the example of FIG. 3, the end portions of the sealing layers SE1 and SE2 located on the upper portion 62 of the partition 6 between subpixels SP1 and SP2 are spaced apart from each other. The end portions of the sealing layers SE1 and SE3 located on the upper portion 62 of the partition 6 between subpixels SP1 and SP3 are spaced apart from each other.

The sealing layers SE1, SE2 and SE3 are covered with a resin layer 13. The resin layer 13 is covered with a sealing layer 14. Further, the sealing layer 14 is covered with a resin layer 15.

The organic insulating layer 12 and the resin layers 13 and 15 are formed of an organic material. The rib 5 and the sealing layers 14, SE1, SE2 and SE3 are formed of, for example, an inorganic material such as silicon nitride (SiNx). Each of the rib 5 and the sealing layers 14, SE1, SE2 and SE3 may be formed as a single-layer body of one of silicon oxide (SiOx), silicon oxynitride (SiON) and aluminum oxide ($Al_2O_3$). Each of the rib 5 and the sealing layers 14, SE1, SE2 and SE3 may be formed as a stacked layer body of a combination consisting of at least two of a silicon nitride layer, a silicon oxide layer, a silicon oxynitride layer and an aluminum oxide layer.

Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO).

The upper electrodes UE1, UE2 and UE3 are formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer.

Each of the cap layers CP1, CP2 and CP3 is formed of, for example, a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

The lower portion 61 of the partition 6 is formed of, for example, aluminum (Al). The lower portion 61 may be formed of an aluminum alloy such as an aluminum-neodymium alloy (AlNd) or may comprise a multilayer structure consisting of an aluminum layer and an aluminum alloy layer. Further, the lower portion 61 may comprise a thin film formed of a metal material different from aluminum and an aluminum alloy under the aluminum layer or the aluminum alloy layer. This thin film can be formed of, for example, molybdenum (Mo).

For example, the upper portion 62 of the partition 6 comprises a multilayer structure consisting of a first thin film formed of a metal material such as titanium (Ti) and a second thin film formed of conductive oxide such as ITO. The upper portion 62 may comprise a single-layer structure of a metal material such as titanium.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the first lower electrode LE1 and the first upper electrode UE1, the light emitting layer of the first organic layer OR1 emits light in a blue wavelength range. When a potential difference is formed between the second lower electrode LE2 and the second upper electrode UE2, the light emitting layer of the second organic layer OR2 emits light in a green wavelength range. When a potential difference is formed between the third lower electrode LE3 and the third upper electrode UE3, the light emitting layer of the third organic layer OR3 emits light in a red wavelength range.

Figure 4:
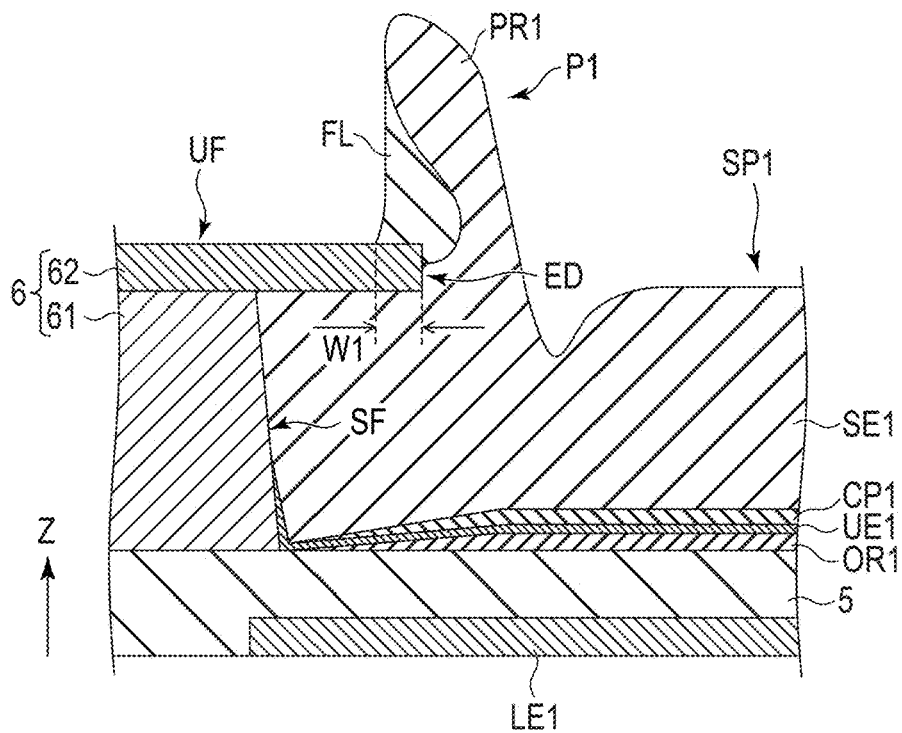
FIG. 4 is a schematic cross-sectional view showing the structure of a partition which surrounds a first subpixel and its vicinity.
Figure 5:
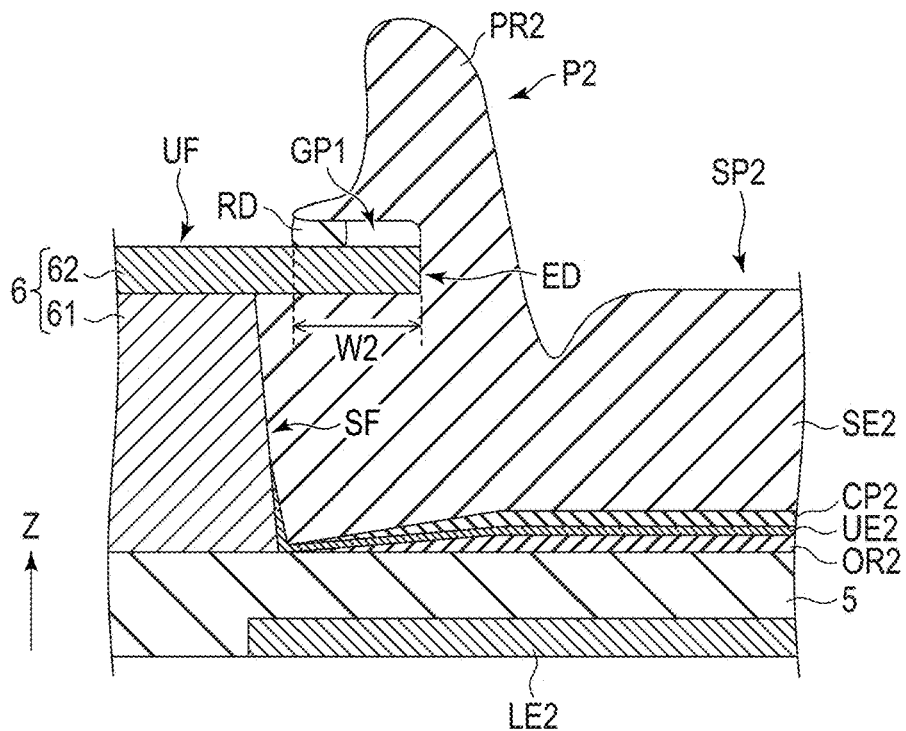
FIG. 5 is a schematic cross-sectional view showing the structure of the partition which surrounds a second subpixel and its vicinity.

FIG. 4 is a schematic cross-sectional view showing the structure of the partition 6 which surrounds the first subpixel SP1 and its vicinity. FIG. 5 is a schematic cross-sectional view showing the structure of the partition 6 which surrounds the second subpixel SP2 and its vicinity. FIG. 6 is a schematic cross-sectional view showing the structure of the partition 6 which surrounds the third subpixel SP3 and its vicinity. In these drawings, the substrate 10, the circuit layer 11, the organic insulating layer 12, the resin layer 13, the sealing layer 14 and the resin layer 15 are omitted.

As shown in FIG. 4 to FIG. 6, the lower portion 61 of the partition 6 comprises a side surface SF. The upper portion 62 of the partition 6 comprises an end portion ED which protrudes from the side surface SF, and an upper surface UF. The upper electrodes UE1, UE2 and UE3 are in contact with the side surfaces SF.

As shown in FIG. 4, the first sealing layer SE1 comprises a first portion P1 which protrudes relative to the upper surface UF in a third direction Z. The first portion P1 is partly located on the upper portion 62.

The first portion P1 comprises a protrusion PR1 and a filling portion FL. The protrusion PR1 is continuous with, of the first sealing layer SE1, the portion which covers the first cap layer CP1. The protrusion PR1 is curved such that the upper end portion juts into the upper side of the upper portion 62. The hollow formed on a side surface of the protrusion PR1 having this shape is filled with the filling portion FL. In the example of FIG. 4, the protrusion PR1 is not in contact with the upper surface UF. The filling portion FL is in contact with the upper surface UF. As another example, the protrusion PR1 may be partly in contact with the upper surface UF.

The protrusion PR1 and the filling portion FL are formed of the same material. Thus, in some cases, the protrusion PR1 is integrated with the filling portion FL, and the boundary between them is not generated.

As shown in FIG. 5, the second sealing layer SE2 comprises a second portion P2 which protrudes relative to the upper surface UF in the third direction Z. The second portion P2 is partly located on the upper portion 62.

The second portion P2 comprises a protrusion PR2 and a blocking portion RD. The protrusion PR2 is continuous with, of the second sealing layer SE2, the portion which covers the second cap layer CP2. The protrusion PR2 is also located above the upper portion 62 and faces the upper surface UF across an intervening gap GP1. The entrance portion of the gap GP1 is blocked by the blocking portion RD. In other words, the gap GP1 is a gap closed by the second portion P2 and the upper portion 62. The height of the gap GP1 is equivalent to, for example, the total thickness of the second organic layer OR2, the second upper electrode UE2 and the second cap layer CP2.

The protrusion PR2 and the blocking portion RD are formed of the same material. Thus, in some cases, the protrusion PR2 is integrated with the blocking portion RD, and the boundary between them is not generated.

As shown in FIG. 6, the third sealing layer SE3 comprises a third portion P3 which protrudes relative to the upper surface UF in the third direction Z. The third portion P3 is partly located above the upper portion 62 and faces the upper surface UF across an intervening gap GP2. The gap GP2 is not closed in a manner different from that of the gap GP1. In other words, the gap GP2 is an open gap. The height of the gap GP2 is equivalent to, for example, the total thickness of the third organic layer OR3, the third upper electrode UE3 and the third cap layer CP3.

As shown in FIG. 4, the area in which the first portion P1 overlaps the upper portion 62 in the third direction Z has a first width W1. As shown in FIG. 5, the area in which the second portion P2 overlaps the upper portion 62 in the third direction Z has a second width W2. As shown in FIG. 6, the area in which the third portion P3 overlaps the upper portion 62 in the third direction Z has a third width W3. For example, these widths W1, W2 and W3 are mean values around subpixels SP1, SP2 and SP3, respectively.

In the present embodiment, at least two of widths W1, W2 and W3 are different from each other. Specifically, the first width W1 is less than the second width W2 (W1<W2). Further, the third width W3 is greater than the second width W2 (W2<W3). Thus, in this example, widths W1, W2 and W3 are different from each other.

In this way, in the present embodiment, the shapes of the end portions of the sealing layers SE1, SE2 and SE3 located on the partition 6 are different from each other. This configuration is generated when the display device DSP is manufactured by the manufacturing method explained below.

Figure 7:
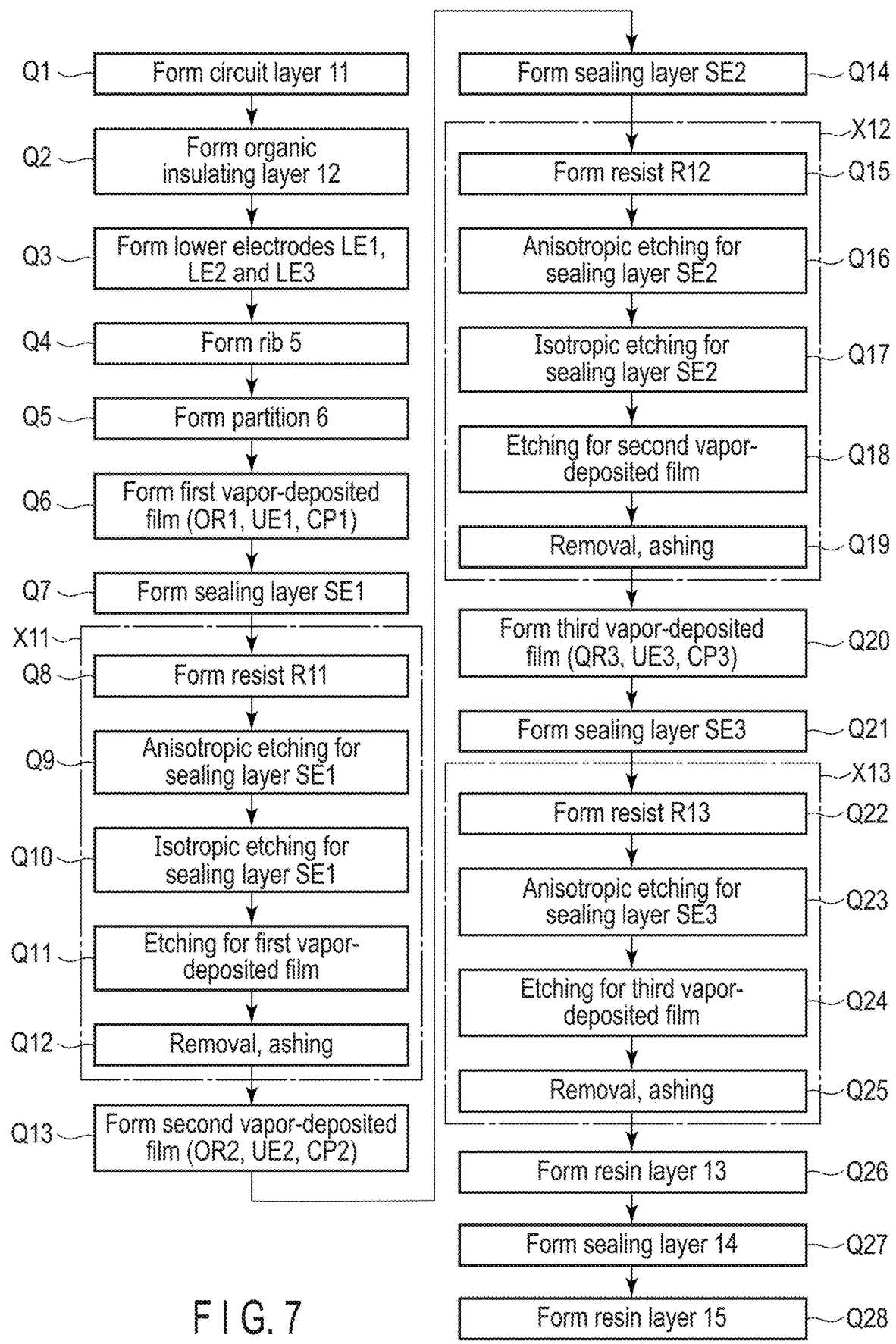
FIG. 7 is a flowchart showing an example of the manufacturing method of the display device according to the first embodiment.

FIG. 7 is a flowchart showing an example of the manufacturing method of the display device DSP according to the present embodiment. FIG. 8 to FIG. 18 are schematic cross-sectional views for explaining the process shown in FIG. 7. In the drawings, (a), (b) and (c) show the structure of the partition 6 which surrounds the first subpixel SP1 and its vicinity, the structure of the partition 6 which surrounds the second subpixel SP2 and its vicinity, and the structure of the partition 6 which surrounds the third subpixel SP3 and its vicinity, respectively.

To manufacture the display device DSP, first, the circuit layer 11 is formed on the substrate 10 (process Q1), and the organic insulating layer 12 which covers the circuit layer 11 is formed (process Q2), and the lower electrodes LE1, LE2 and LE3 are formed on the organic insulating layer 12 (process Q3).

Further, the rib 5 is formed on the lower electrodes LE1, LE2 and LE3 (process Q4), and the partition 6 is formed on the rib 5 (process Q5). The pixel apertures AP1, AP2 and AP3 of the rib 5 may be formed before process Q5 or may be formed after process Q5.

Subsequently, a process for forming the display elements DE1, DE2 and DE3 is performed. The present embodiment assumes a case where the first display element DE1 overlapping the largest first pixel aperture AP1 in area among the pixel apertures AP1, AP2 and AP3 is formed firstly, and the second display element DE2 overlapping the second largest pixel aperture AP2 in area is formed secondly, and the third display element DE3 overlapping the smallest third pixel aperture AP3 in area is formed lastly. It should be noted that the formation order of the display elements DE1, DE2 and DE3 is not limited to this example.

Figure 8:
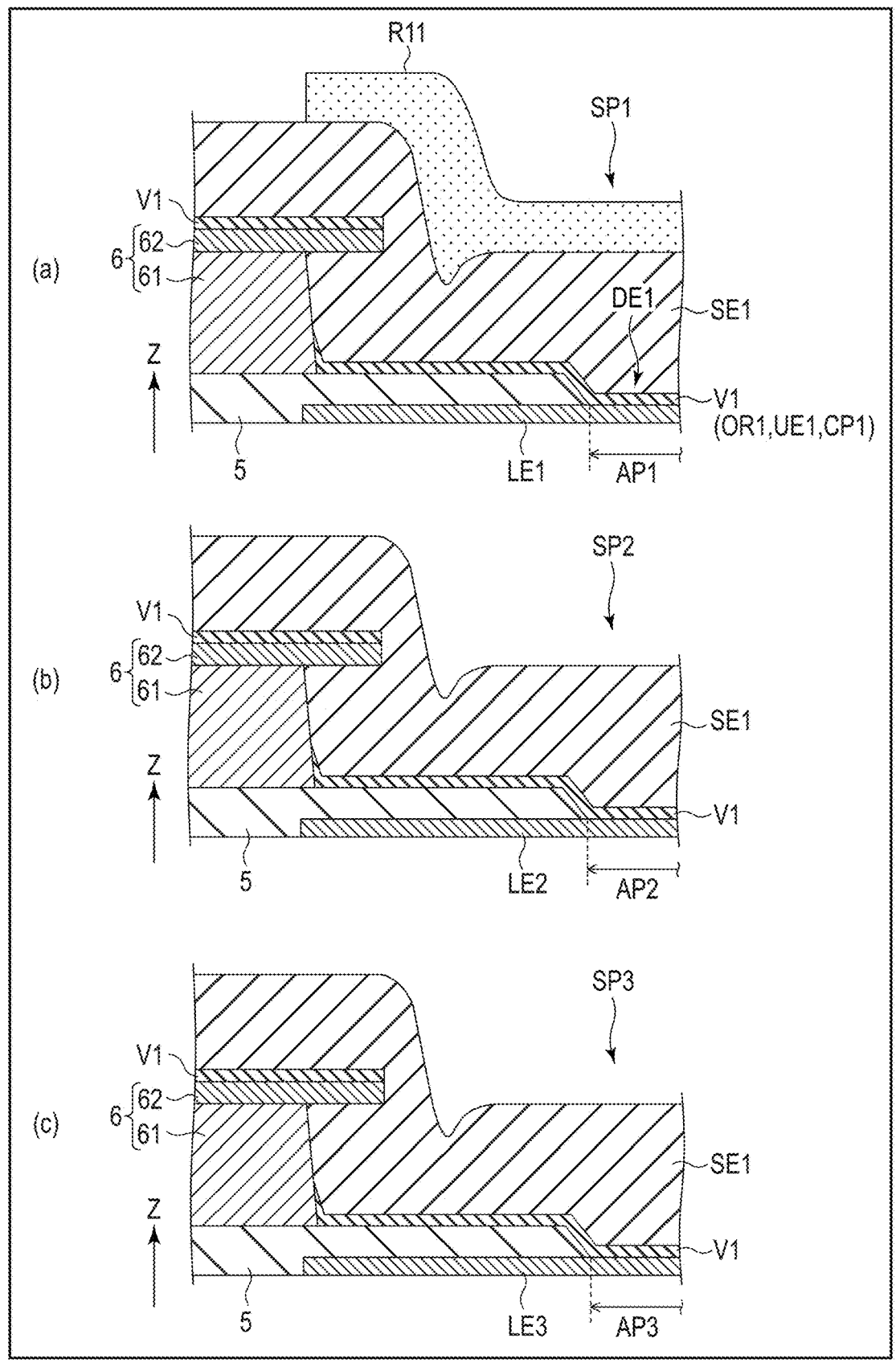
FIG. 8 is a schematic cross-sectional view showing a process of the manufacturing method of FIG. 7.

To form the first display element DE1, as shown in FIG. 8, the first organic layer OR1 which is in contact with the first lower electrode LE1 through the first pixel aperture AP1, the first upper electrode UE1 which covers the first organic layer OR1 and the first cap layer CP1 which covers the first upper electrode UE1 are formed in order by vapor deposition (process Q6). In the following explanation, the first organic layer OR1, the first upper electrode UE1 and the first cap layer CP1 are referred to as a first vapor-deposited film V1. After forming the first vapor-deposited film V1, the first sealing layer SE1 which covers the first vapor-deposited film V1 is formed (process Q7).

The first vapor-deposited film V1 and the first sealing layer SE1 are formed in the entire display area DA. Thus, as shown in FIG. 8(a), FIG. 8(b) and FIG. 8(c), the first vapor-deposited film V1 and the first sealing layer SE1 are located above the second lower electrode LE2 and the third lower electrode LE3 in addition to the first lower electrode LE1. As shown in FIG. 8(a), the first display element DE1 including the first vapor-deposited film V1 and the first lower electrode LE1 is formed in the first subpixel SP1.

The first vapor-deposited film V1 is divided by the partition 6 having an overhang shape. Thus, of the first vapor-deposited film V1, the portion located on the upper portion 62 is spaced apart from, of the first vapor-deposited film V1, the portion located on the rib 5. The first sealing layer SE1 is not divided by the partition 6 and is continuous.

After process Q7, a first patterning process X11 for, of the first sealing layer SE1 and the first vapor-deposited film V1, maintaining the portion located above the first lower electrode LE1 and removing the portion located above the second lower electrode LE2 and the third lower electrode LE3 is performed.

In the first patterning process X11, firstly, as shown in FIG. 8(a), a resist R11 is formed on the first sealing layer SE1 (process Q8). The resist R11 is provided above the first lower electrode LE1 and is not provided above the second lower electrode LE2 or the third lower electrode LE3. The resist R11 overlaps part of the partition 6 surrounding the first subpixel SP1 in the third direction Z.

Figure 9:
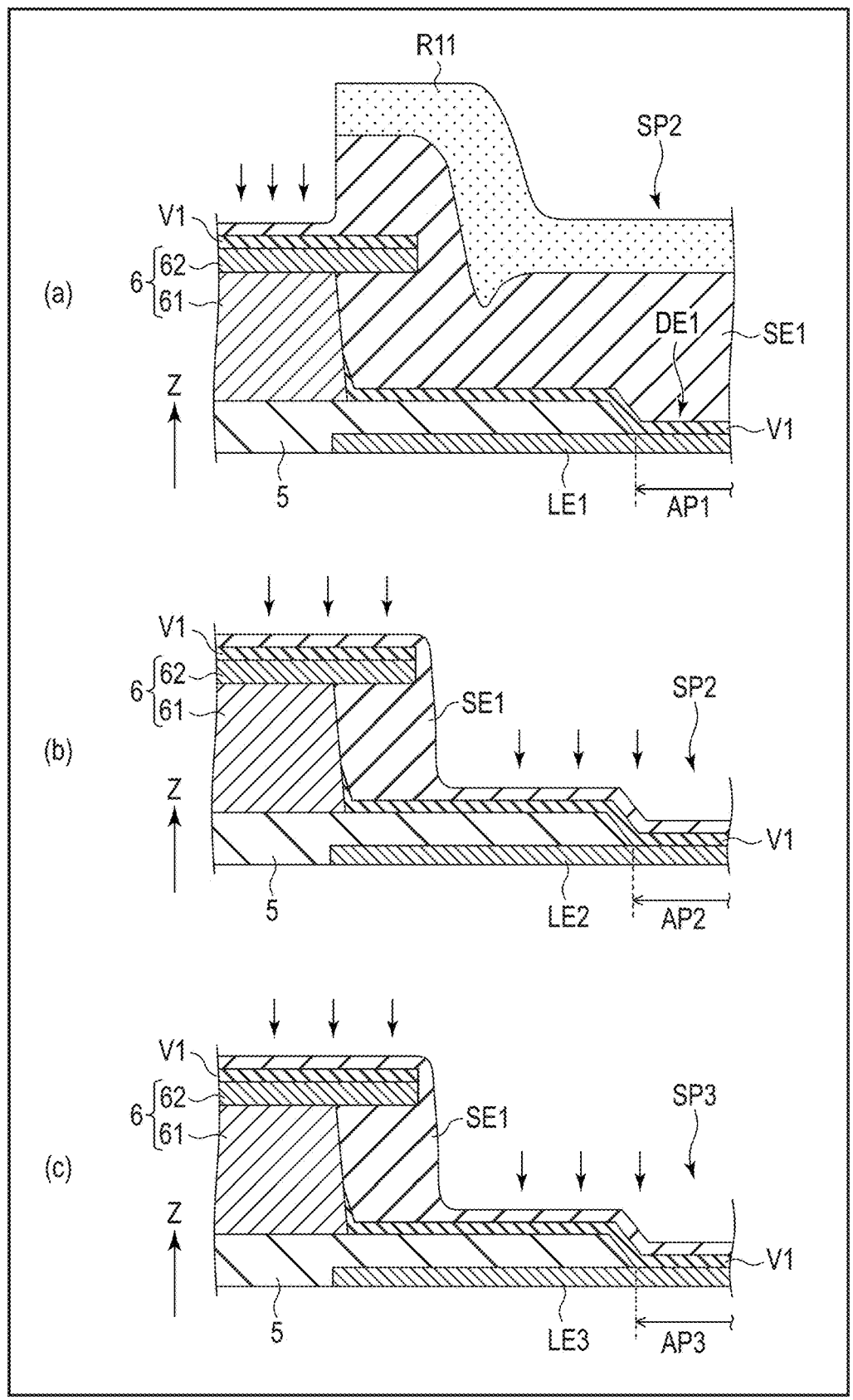
FIG. 9 is a schematic cross-sectional view showing the process subsequent to FIG. 8.

After process Q8, anisotropic dry etching is performed for the first sealing layer SE1 using the resist R11 as a mask (process Q9). FIG. 9 shows how the first sealing layer SE1 is corroded by the anisotropic dry etching. As shown in FIG. 9(a), of the first sealing layer SE1, the thickness of the portion exposed from the resist R11 on the partition 6 is reduced near the first subpixel SP1. As shown in FIG. 9(b) and FIG. 9(c), the thickness of the first sealing layer SE1 is reduced as a whole in the second subpixel SP2 and the third subpixel SP3 and near these subpixels. It should be noted that, as this anisotropic dry etching has directivity substantially parallel to the third direction Z, the first sealing layer SE1 is not substantially corroded under the upper portion 62 shown in FIG. 9(b) and FIG. 9(c).

After process Q9, isotropic dry etching is performed for the first sealing layer SE1 (process Q10). FIG. 10 shows how the first sealing layer SE1 is corroded by the isotropic dry etching. In this isotropic dry etching, of the first sealing layer SE1, the portion whose thickness is reduced by anisotropic dry etching is completely removed.

Further, in this isotropic dry etching, as shown in FIG. 10(a), the first sealing layer SE1 located under the resist R11 is partly corroded. As shown in FIG. 10(b) and FIG. 10(c), the first sealing layer SE1 which remains under the upper portion 62 surrounding subpixels SP2 and SP3 is removed.

After process Q10, etching is performed for the first vapor-deposited film V1 using the resist R11 as a mask (process Q11). Further, the resist R11 is removed, and the residue is removed by ashing (process Q12). For example, etching for the first vapor-deposited film V1 includes wet etching or ashing for the first cap layer CP1, wet etching for the first upper electrode UE1 and ashing for the first organic layer OR1.

FIG. 11 shows the states of subpixels SP1, SP2 and SP3 which underwent processes Q11 and Q12. In the example of FIG. 11(a), the first vapor-deposited film V1 located on the partition 6 surrounding the first subpixel SP1 is removed by the etching of process Q11. Thus, a gap GP0 is defined between the upper portion 62 and, of the first sealing layer SE1, the protrusion PR1 (the first portion P1) which protrudes from the upper portion 62. It should be noted that the first vapor-deposited film V1 may partly remain in the gap GP0. As shown in FIG. 11(b) and FIG. 11(c), in subpixels SP2 and SP3, the first vapor-deposited film V1 is removed as a whole, and the lower electrodes LE2 and LE3 are exposed through the pixel apertures AP2 and AP3, respectively.

After the first patterning process X11 described above, a process for forming the second display element DE2 is performed. Specifically, as shown in FIG. 12, the second organic layer OR2, the second upper electrode UE2 which covers the second organic layer OR2 and the second cap layer CP2 which covers the second upper electrode UE2 are formed in order for the entire display area DA by vapor deposition (process Q13). In the second subpixel SP2, the second organic layer OR2 is in contact with the second lower electrode LE2 through the second pixel aperture AP2. In the following explanation, the second organic layer OR2, the second upper electrode UE2 and the second cap layer CP2 are referred to as a second vapor-deposited film V2. After forming the second vapor-deposited film V2, the second sealing layer SE2 which covers the second vapor-deposited film V2 is formed (process Q14).

As shown in FIG. 12(b), the second display element DE2 including the second vapor-deposited film V2 and the second lower electrode LE2 is formed in the second subpixel SP2. As shown in FIG. 12(b) and FIG. 12(c), the second vapor-deposited film V2 is divided by the partition 6 having an overhang shape in subpixels SP2 and SP3. The second sealing layer SE2 is not divided by the partition 6 and is continuous.

As shown in FIG. 12(a), the first sealing layer SE1 is covered with the second vapor-deposited film V2 in the first subpixel SP1. As the side surface of the protrusion PR1 located on the partition 6 is steep, the second vapor-deposited film V2 could break in the side surface. The second vapor-deposited film V2 could also break near the gap GP0.

After process Q14, a second patterning process X12 for, of the second sealing layer SE2 and the second vapor-deposited film V2, maintaining the portion located above the second lower electrode LE2 and removing the portion located above the first lower electrode LE1 and the third lower electrode LE3 is performed.

In the second patterning process X12, firstly, as shown in FIG. 12(b), a resist R12 is formed on the second sealing layer SE2 (process Q15). The resist R12 is provided above the second lower electrode LE2 and is not provided above the first lower electrode LE1 or the third lower electrode LE3. The resist R12 overlaps part of the partition 6 surrounding the second subpixel SP2 in the third direction Z.

Figure 13:
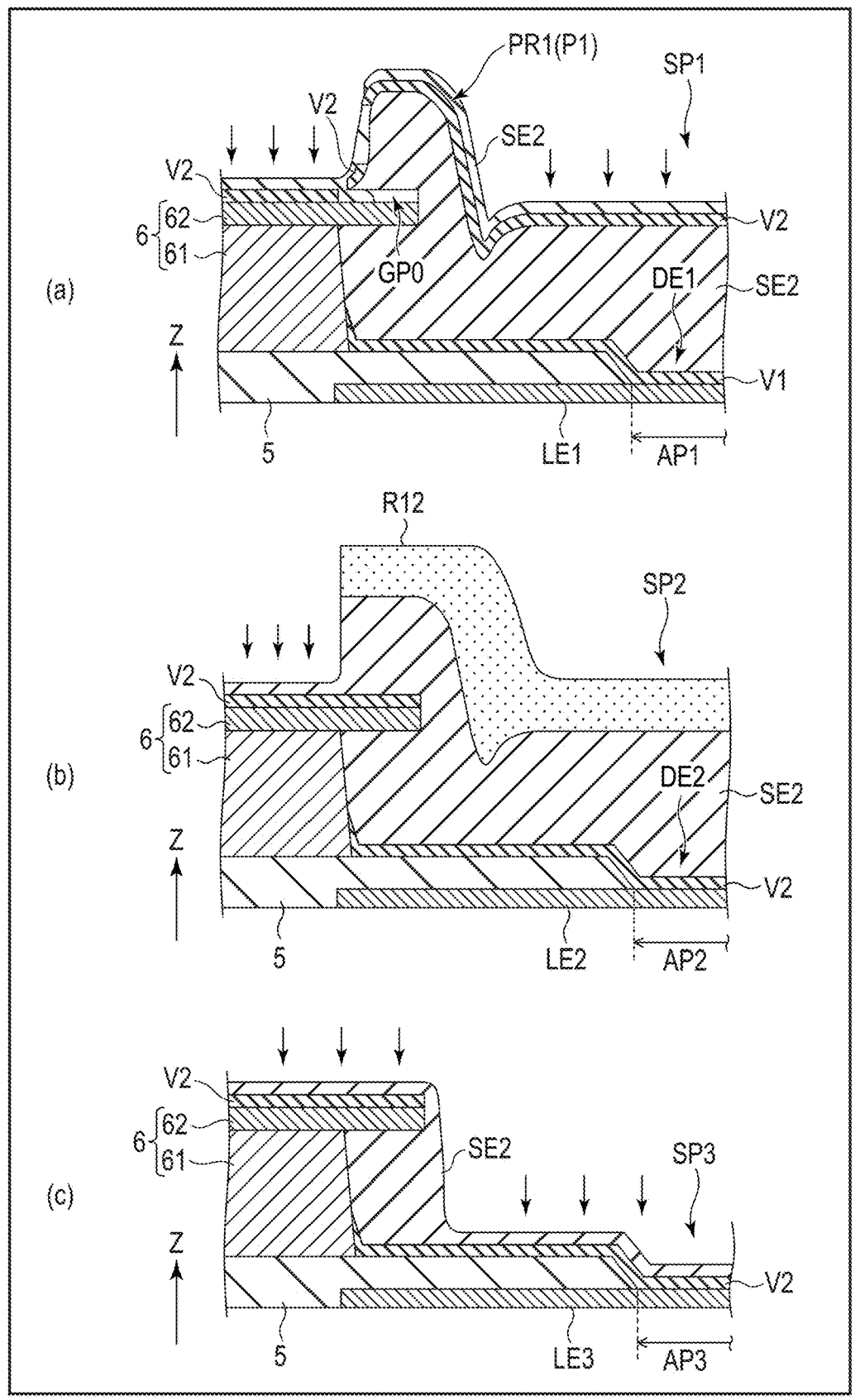
FIG. 13 is a schematic cross-sectional view showing the process subsequent to FIG. 12.

After process Q15, anisotropic dry etching is performed for the second sealing layer SE2 using the resist R12 as a mask (process Q16). FIG. 13 shows how the second sealing layer SE2 is corroded by the anisotropic dry etching. As shown in FIG. 13(b), of the second sealing layer SE2, the thickness of the portion exposed from the resist R12 on the partition 6 is reduced near the second subpixel SP2. As shown in FIG. 13(a) and FIG. 13(c), the thickness of the second sealing layer SE2 is reduced as a whole in the first subpixel SP1 and the third subpixel SP3 and near these subpixels. It should be noted that, as this anisotropic dry etching has directivity substantially parallel to the third direction Z, the second sealing layer SE2 is not substantially corroded under the upper portion 62 shown in FIG. 13(c).

Figure 14:
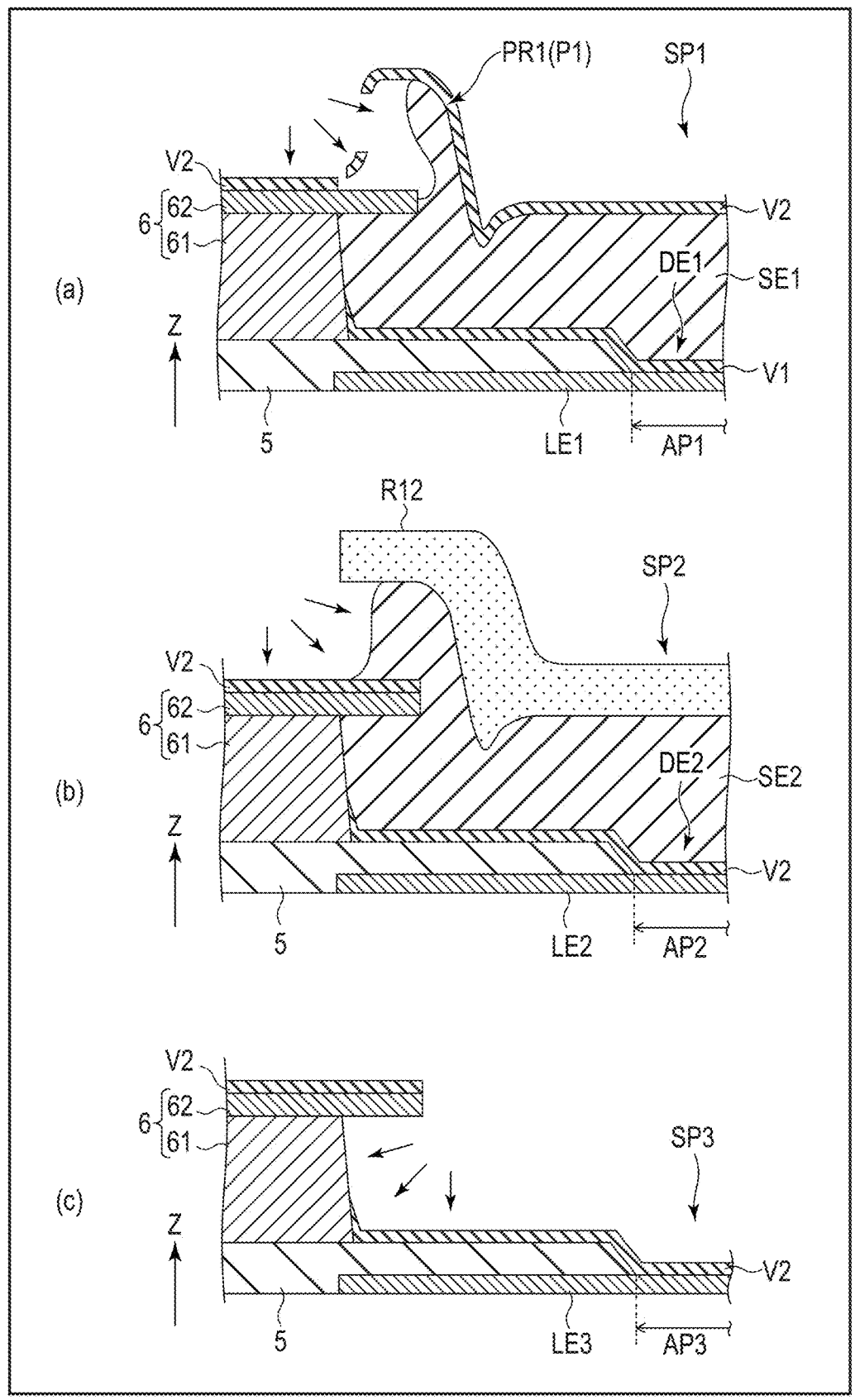
FIG. 14 is a schematic cross-sectional view showing the process subsequent to FIG. 13.

After process Q16, isotropic dry etching is performed for the second sealing layer SE2 (process Q17). FIG. 14 shows how the second sealing layer SE2 is corroded by the isotropic dry etching. In this isotropic dry etching, of the second sealing layer SE2, the portion whose thickness is reduced by anisotropic dry etching is completely removed.

Further, in this isotropic dry etching, as shown in FIG. 14(b), the second sealing layer SE2 located under the resist R12 is partly corroded. As shown in FIG. 14(c), the second sealing layer SE2 which remains under the upper portion 62 surrounding the third subpixel SP3 is removed.

The second vapor-deposited film V2 functions as an etching stopper for the isotropic dry etching. Thus, as shown in FIG. 14(a), of the first sealing layer SE1, the portion covered with the second vapor-deposited film V2 is not corroded. However, in the example of FIG. 14(a), the second vapor-deposited film V2 breaks on the partition 6 around the first subpixel SP1. Thus, through the broken area, the first sealing layer SE1 is corroded. In this way, the width of the protrusion PR1 could be reduced.

After process Q17, etching is performed for the second vapor-deposited film V2 using the resist R12 as a mask (process Q18). Further, the resist R12 is removed, and the residue is removed by ashing (process Q19). For example, etching for the second vapor-deposited film V2 includes wet etching or ashing for the second cap layer CP2, wet etching for the second upper electrode UE2 and ashing for the second organic layer OR2.

Figure 15:
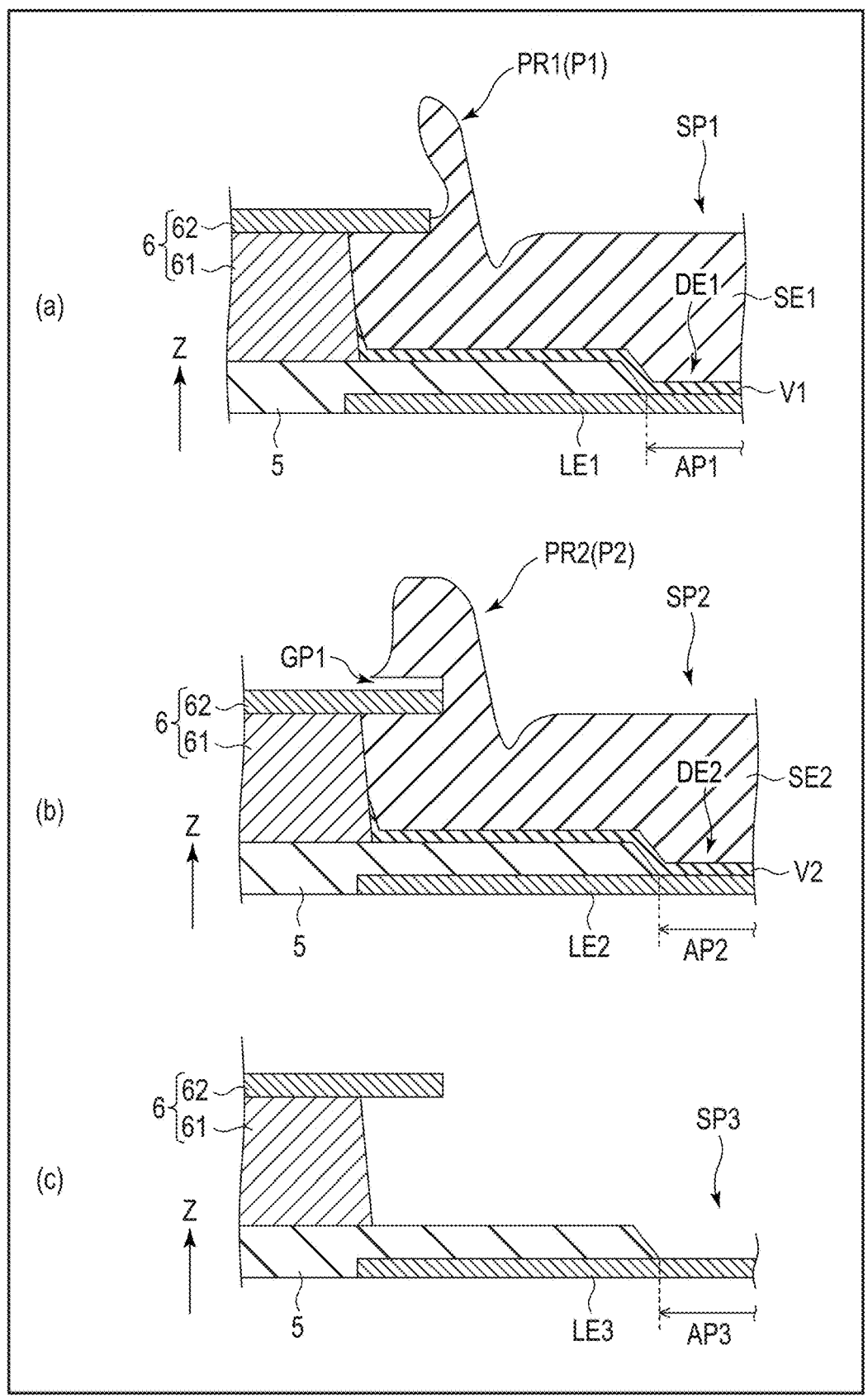
FIG. 15 is a schematic cross-sectional view showing the process subsequent to FIG. 14.

FIG. 15 shows the states of subpixels SP1, SP2 and SP3 which underwent processes Q18 and Q19. In the example of FIG. 15(b), the second vapor-deposited film V2 located on the partition 6 surrounding the second subpixel SP2 is removed by the etching of process Q18. Thus, the gap GP1 is defined between the upper portion 62 and, of the second sealing layer SE2, the protrusion PR2 (the second portion P2) which protrudes from the upper portion 62. It should be noted that the second vapor-deposited film V2 may partly remain in the gap GP1. As shown in FIG. 15(a) and FIG. 15(c), the second vapor-deposited film V2 is removed as a whole in subpixels SP1 and SP3. In the third subpixel SP3, the third lower electrode LE3 is exposed through the third pixel aperture AP3.

Figure 16:
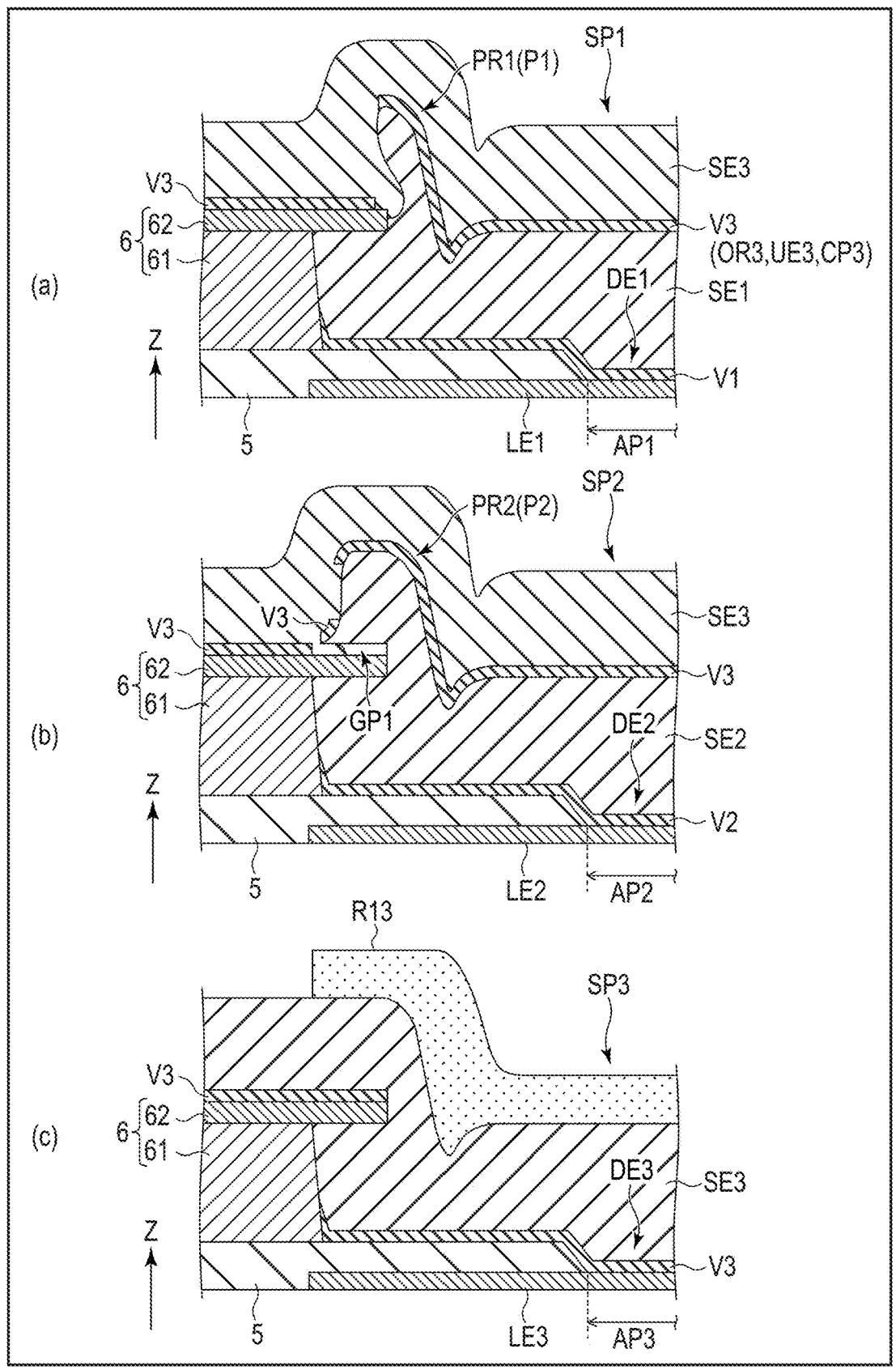
FIG. 16 is a schematic cross-sectional view showing the process subsequent to FIG. 15.

After the second patterning process X12 described above, a process for forming the third display element DE3 is performed. Specifically, as shown in FIG. 16, the third organic layer OR3, the third upper electrode UE3 which covers the third organic layer OR3 and the third cap layer CP3 which covers the third upper electrode UE3 are formed in order for the entire display area DA by vapor deposition (process Q20). In the third subpixel SP3, the third organic layer OR3 is in contact with the third lower electrode LE3 through the third pixel aperture AP3. In the following explanation, the third organic layer OR3, the third upper electrode UE3 and the third cap layer CP3 are referred to as a third vapor-deposited film V3. After forming the third vapor-deposited film V3, the third sealing layer SE3 which covers the third vapor-deposited film V3 is formed (process Q21).

As shown in FIG. 16(c), the third display element DE3 including the third vapor-deposited film V3 and the third lower electrode LE3 is formed in the third subpixel SP3. The third vapor-deposited film V3 is divided by the partition 6 having an overhang shape in the third subpixel SP3. The third sealing layer SE3 is not divided by the partition 6 and is continuous.

As shown in FIG. 16(a), the first sealing layer SE1 is covered with the third vapor-deposited film V3 in the first subpixel SP1. As the side surface of the protrusion PR1 located on the partition 6 is steep, the third vapor-deposited film V3 could break in the side surface. As shown in FIG. 16(b), the second sealing layer SE2 is covered with the third vapor-deposited film V3 in the second subpixel SP2. As the side surface of the protrusion PR2 located on the partition 6 is steep, the third vapor-deposited film V3 could break in the side surface. The third vapor-deposited film V3 could also break near the gap GP1.

After process Q21, a third patterning process X13 for, of the third sealing layer SE3 and the third vapor-deposited film V3, maintaining the portion located above the third lower electrode LE3 and removing the portion located above the first lower electrode LE1 and the second lower electrode LE2 is performed.

In the third patterning process X13, firstly, as shown in FIG. 16(c), a resist R13 is formed on the third sealing layer SE3 (process Q22). The resist R13 is provided above the third lower electrode LE3 and is not provided above the first lower electrode LE1 or the second lower electrode LE2. The resist R13 overlaps part of the partition 6 surrounding the third subpixel SP3 in the third direction Z.

After process Q22, anisotropic dry etching is performed for the third sealing layer SE3 using the resist R13 as a mask (process Q23). In the present embodiment, the intensity of the anisotropic dry etching of process Q23 is greater than that of the anisotropic dry etching of processes Q9 and Q16. Specifically, the processing time of the anisotropic dry etching of process Q23 is longer than that of the anisotropic dry etching of processes Q9 and Q16.

Figure 17:
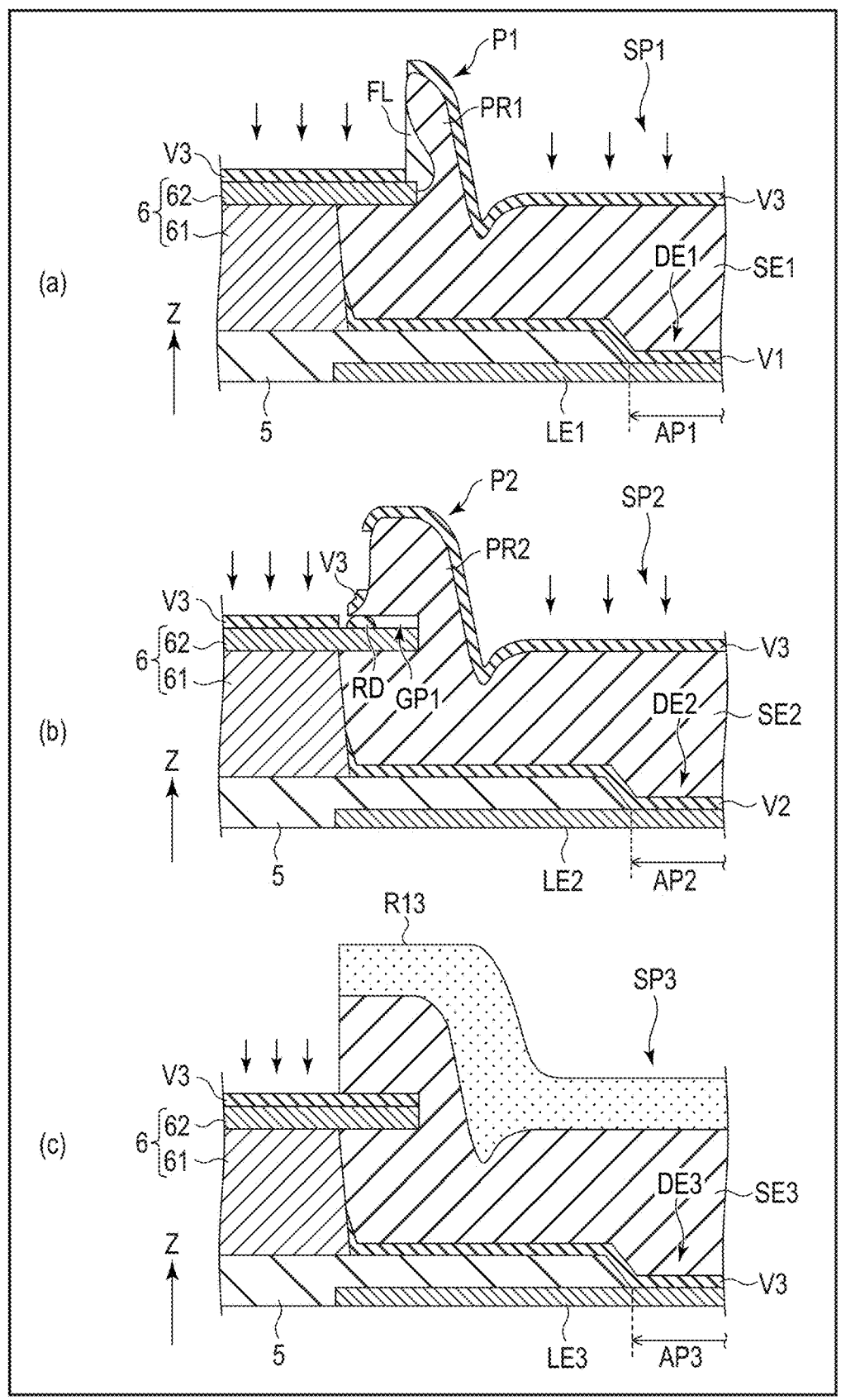
FIG. 17 is a schematic cross-sectional view showing the process subsequent to FIG. 16.

FIG. 17 shows how the third sealing layer SE3 is corroded by the anisotropic dry etching of process Q23. As shown in FIG. 17(c), of the third sealing layer SE3, the portion exposed from the resist R13 on the partition 6 is entirely removed near the third subpixel SP3. As shown in FIG. 17(a) and FIG. 17(b), the third sealing layer SE3 is removed as a whole in the first subpixel SP1 and the second subpixel SP2 and near these subpixels.

The third vapor-deposited film V3 functions as an etching stopper for the anisotropic dry etching. Thus, as shown in FIG. 17(a) and FIG. 17(b), of the first sealing layer SE1 and the second sealing layer SE2, the portion covered with the third vapor-deposited film V3 is not corroded.

It should be noted that the anisotropic dry etching of process Q22 has directivity substantially parallel to the third direction Z. Therefore, as shown in FIG. 17(a), in the hollow of the side surface of the protrusion PR1, the third sealing layer SE3 partly remains, and the filling portion FL shown in FIG. 4 is formed. As shown in FIG. 17(b), near the entrance of the gap GP1, the third sealing layer SE3 partly remains, and the blocking portion RD shown in FIG. 5 is formed.

The third patterning process X13 does not include the isotropic dry etching of the first patterning process X11 or the second patterning process X12. After process Q23, etching is performed for the third vapor-deposited film V3 using the resist R13 as a mask (process Q24). Further, the resist R13 is removed, and the residue is removed by asking (process Q25). For example, etching for the third vapor-deposited film V3 includes wet etching or ashing for the third cap layer CP3, wet etching for the third upper electrode UE3 and ashing for the third organic layer OR3.

Figure 18:
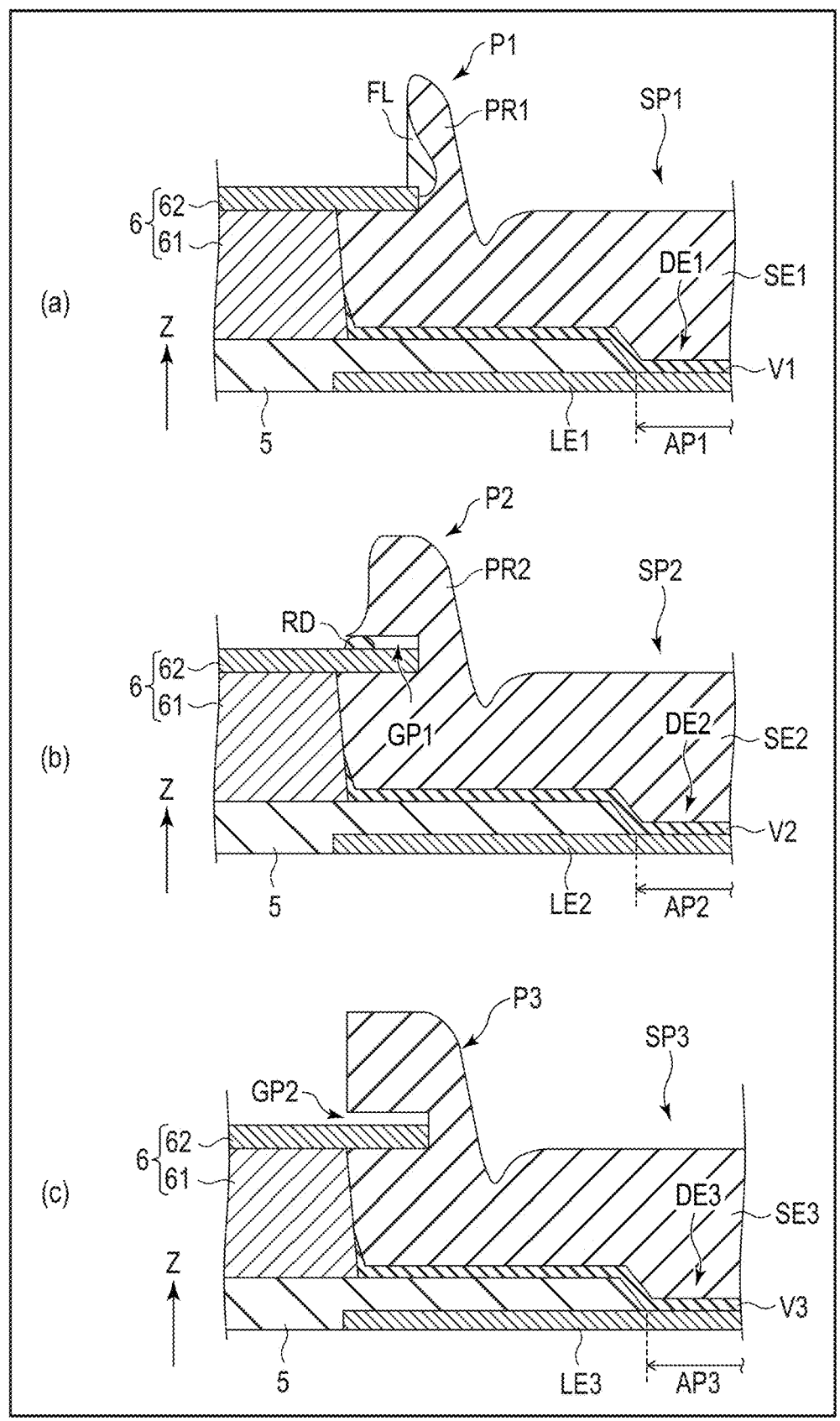
FIG. 18 is a schematic cross-sectional view showing the process subsequent to FIG. 17.

FIG. 18 shows the states of subpixels SP1, SP2 and SP3 which underwent processes Q24 and Q25. In the example of FIG. 18(c), the third vapor-deposited film V3 located on the partition 6 surrounding the third subpixel SP3 is removed by the etching of process Q24. Thus, the gap GP2 is defined between the upper portion 62 and, of the third sealing layer SE3, the third portion P3 which protrudes from the upper portion 62. It should be noted that the third vapor-deposited film V3 may partly remain in the gap GP2. As shown in FIG. 18(a) and FIG. 18(b), the third vapor-deposited film V3 is removed as a whole in subpixels SP1 and SP2.

After the display elements DE1, DE2 and DE3 and the sealing layers SE1, SE2 and SE3 which cover these display elements are formed in the above manner, the resin layer 13 shown in FIG. 3 is formed (process Q26). Further, the sealing layer 14 which covers the resin layer 13 is formed (process Q27), and the resin layer 15 which covers the sealing layer 14 is formed (process Q28). In this way, the display device DSP comprising the structure shown in FIG. 3 to FIG. 6 is obtained.

For the anisotropic dry etching of processes Q9, Q16 and Q23 and the isotropic dry etching of processes Q10 and Q17, for example, an etching gas containing fluorine is used. For the etching gas, for example, sulfur hexafluoride ($SF_6$), tetrafluoromethane ($CF_4$), hexafluoroethane ($C_2F_6$), trifluoromethane ($CHF_3$) or nitrogen trifluoride ($NF_3$) may be used.

In the present embodiment, the width of the area in which the resist R11 overlaps the partition 6 surrounding the first subpixel SP1, the width of the area in which the resist R12 overlaps the partition 6 surrounding the second subpixel SP2 and the width of the area in which the resist R13 overlaps the partition 6 surrounding the third subpixel SP3 are equal to each other. Thus, the relationships of the first width W1 of the first portion P1 formed through two isotropic dry etching processes (processes Q10 and Q17), the second width W2 of the second portion P2 formed through one isotropic dry etching process (process Q17) and the third width W3 of the third portion P3 formed without any isotropic dry etching process are shown as W1<W2 and W2<W3 as described above.

In the present embodiment described above, when the sealing layers SE1 and SE2 are patterned, anisotropic dry etching is performed firstly, and isotropic dry etching is performed secondly. If the sealing layers SE1 and SE2 are entirely patterned by isotropic dry etching, the sealing layers SE1 and SE2 located under the resists R11 and R12 are largely corroded from a lateral side, and moisture permeation paths to the display elements DE1 and DE2 could be generated.

Unlike such a method, when isotropic dry etching is performed after the thicknesses of the sealing layers SE1 and SE2 are reduced by anisotropic dry etching, the corrosion of the sealing layers SE1 and SE2 located under the resists R11 and R12 can be reduced.

If the sealing layers SE1 and SE2 are entirely patterned by anisotropic dry etching, there is a possibility that, of the sealing layers SE1 and SE2, the portions located under the upper portion 62 of the partition 6 cannot be satisfactorily removed in the subpixels from which the sealing layers SE1 and SE2 should be removed. If such a residue is generated, the sealing layer which is subsequently formed on the residue is not firmly attached to the partition 6 in a satisfactory manner, and a moisture permeation path could be generated. Further, a contact failure between the upper electrode and the lower portion 61 of the partition 6 could be caused.

To the contrary, when isotropic dry etching is performed after anisotropic dry etching, the sealing layers SE1 and SE2 located under the upper portion 62 can be satisfactorily removed.

In the present embodiment, the third sealing layer SE3 is patterned by anisotropic dry etching. Isotropic dry etching is not used for the patterning of the third sealing layer SE3. An example of the effects obtained by this configuration is explained below.

Figure 19:
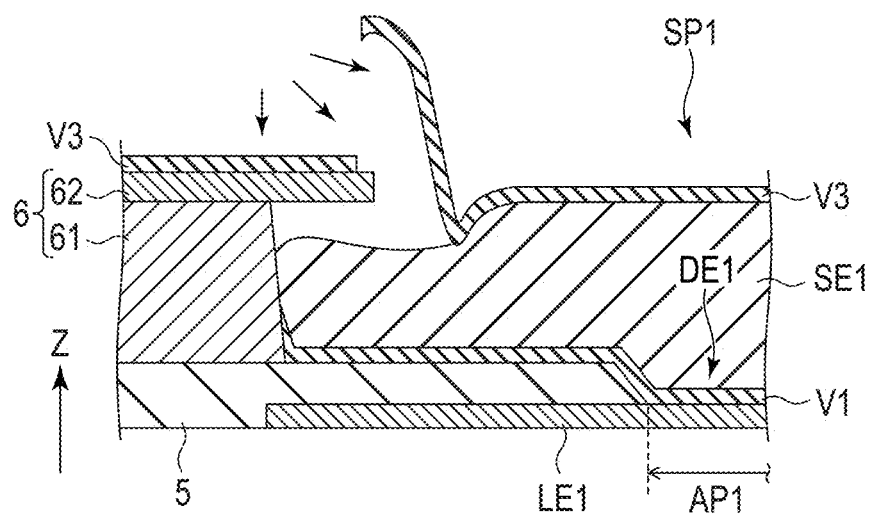
FIG. 19 is a diagram for explaining a manufacturing method according to a comparative example of the first embodiment.

FIG. 19 is a diagram for explaining a manufacturing method according to a comparative example of the present embodiment. This figure shows the structure of the vicinity of the first subpixel SP1 when isotropic dry etching is performed for the third sealing layer SE3 after process Q23 shown in FIG. 18(a).

The width of the first portion P1 shown in FIG. 18(a) is made less after it is subjected to two isotropic dry etching processes. Therefore, if isotropic dry etching is further performed, as shown in FIG. 19, the first portion P1 could be eliminated, and the lower surface of the upper portion 62 of the partition 6 and the side surface of the lower portion 61 could be exposed from the first sealing layer SE1. This creates a risk that moisture permeates the first display element DE1 through the boundary between the partition 6 and the first sealing layer SE1. When moisture permeates the first display element DE1, the display of the first subpixel SP1 is adversely affected, and the display quality could be degraded.

To the contrary, like the present embodiment, when no isotropic dry etching is performed in the patterning of the third sealing layer SE3, the first portion P1 can be maintained. Thus, the moisture permeation of the comparative example can be prevented. Further, as shown in FIG. 4 and FIG. 18(a), when the filling portion FL is formed by the third sealing layer SE3, the width of the first portion P1 is made great. This configuration can more satisfactorily block the moisture permeation path.

When no isotropic dry etching is performed in the patterning of the third sealing layer SE3, the width of the second portion P2 can be also made great in the second subpixel SP2. This configuration can prevent moisture from permeating the second display element DE2.

Further, as shown in FIG. 5 and FIG. 18(b), the entrance portion of the gap GP1 is blocked by the blocking portion RD. This configuration can prevent moisture permeation through the gap GP1. This blocking portion RD could be eliminated when isotropic dry etching is performed in the patterning of the third sealing layer SE3 like the comparative example.

In this way, according to the display device DSP of the present embodiment and its manufacturing method, moisture permeation can be satisfactorily prevented, and the display quality and reliability of the display device DSP can be improved. Various other desirable effects are obtained from the present embodiment.

Second Embodiment

A second embodiment is explained. The same structures as the first embodiment are denoted by the same reference numbers. Thus, overlapping descriptions are omitted.

Figure 20:
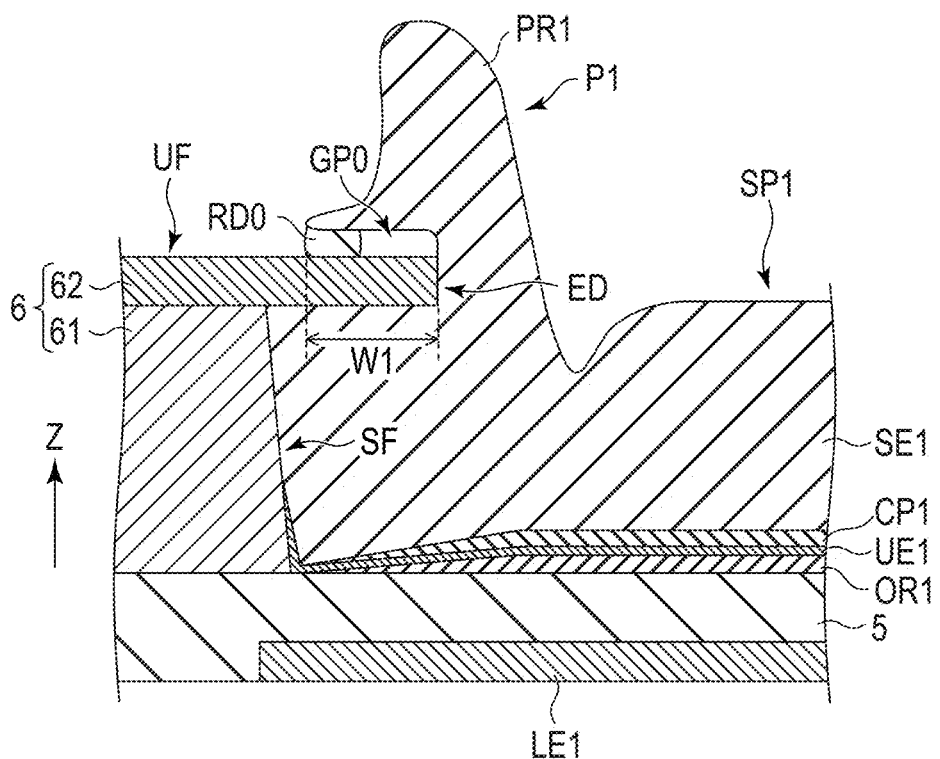
FIG. 20 is a schematic cross-sectional view showing the structure of a partition which surrounds a first subpixel and its vicinity according to a second embodiment.

FIG. 20 is a schematic cross-sectional view showing the structure of a partition 6 which surrounds a first subpixel SP1 and its vicinity according to the second embodiment. In this figure, a substrate 10, a circuit layer 11, an organic insulating layer 12, a resin layer 13, a sealing layer 14 and a resin layer 15 are omitted.

In the present embodiment, a first portion P1 provided in a first sealing layer SE1 does not comprise a filling portion FL. However, a gap GP0 is defined between the first portion P1 and an upper surface UF. The entrance portion of the gap GP0 is blocked by a blocking portion RD0.

It should be noted that the structure of a second subpixel SP2 and its vicinity is the same as FIG. 5, and the structure of a third subpixel SP3 and its vicinity is the same as FIG. 6. For example, in the present embodiment, a first width W1 is equal to a second width W2. In the same manner as the first embodiment, the first width W1 and the second width W2 are less than a third width W3 (W1, W2<W3).

FIG. 21 is a flowchart showing an example of the manufacturing method of a display device DSP according to the present embodiment. FIG. 22 to FIG. 30 are schematic cross-sectional views for explaining the process shown in FIG. 21. In the drawings, (a), (b) and (c) show the structure of the partition 6 which surrounds the first subpixel SP1 and its vicinity, the structure of the partition 6 which surrounds the second subpixel SP2 and its vicinity, and the structure of the partition 6 which surrounds the third subpixel SP3 and its vicinity, respectively.

To manufacture the display device DSP, first, the circuit layer 11, the organic insulating layer 12, lower electrodes LE1, LE2 and LE3, a rib 5 and the partition 6 are formed by the same processes Q1, Q2, Q3, Q4 and Q5 as the first embodiment.

Subsequently, a process for forming display elements DE1, DE2 and DE3 is performed. In the present embodiment, similarly, this specification assumes a case where the first display element DE1 is formed firstly, and the second display element DE2 is formed secondly, and the third display element DE3 is formed lastly. It should be noted that the formation order of the display elements DE1, DE2 and DE3 is not limited to this example.

To form the first display element DE1, first, in a manner similar to that of processes Q6 and Q7 of the first embodiment, a first vapor-deposited film V1 and a first sealing layer SE1 are formed (processes S1 and S2). Subsequently, a first patterning process X21 for, of the first sealing layer SE1 and the first vapor-deposited film V1, maintaining the portion located above the first lower electrode LE1 and the third lower electrode LE3 and removing the portion located above the second lower electrode LE2 is performed.

Figure 22:
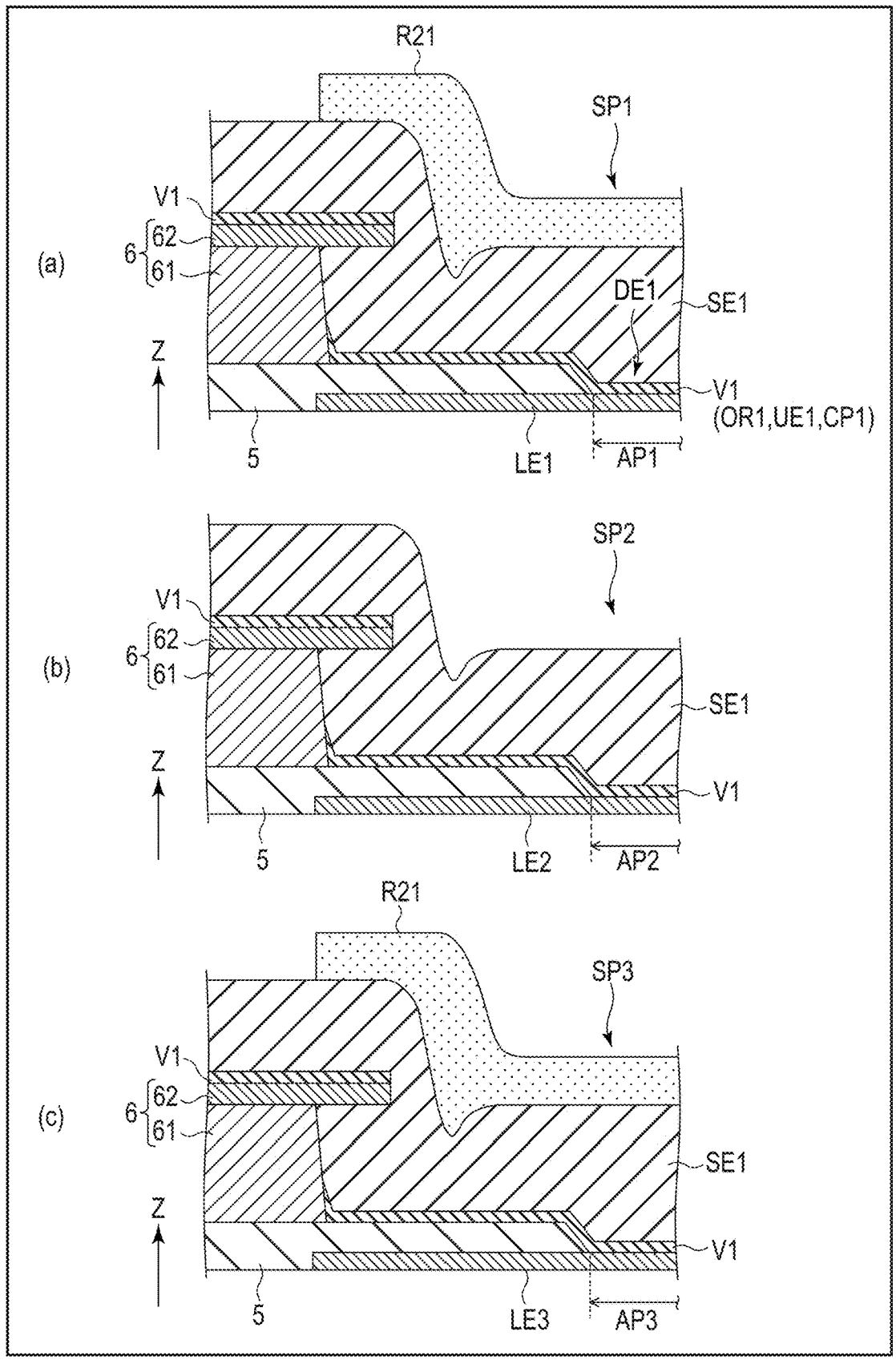
FIG. 22 is a schematic cross-sectional view showing a process of the manufacturing method of FIG. 21.

In the first patterning process X21, firstly, as shown in FIG. 22, a resist R21 is formed on the first sealing layer SE1 (process S3). The resist R21 is provided above the first lower electrode LE1 and the third lower electrode LE3 and is not provided above the second lower electrode LE2. As shown in FIG. 22(a), the resist R21 overlaps part of the partition 6 surrounding the first subpixel SP1 in a third direction Z. As shown in FIG. 22(c), the resist R21 also overlaps part of the partition 6 surrounding the third subpixel SP3 in the third direction Z.

After process S3, in a manner similar to that of processes Q9 and Q10 of the first embodiment, anisotropic dry etching and isotropic dry etching are performed for the first sealing layer SE1 using the resist R21 as a mask (processes S4 and S5).

Figure 23:
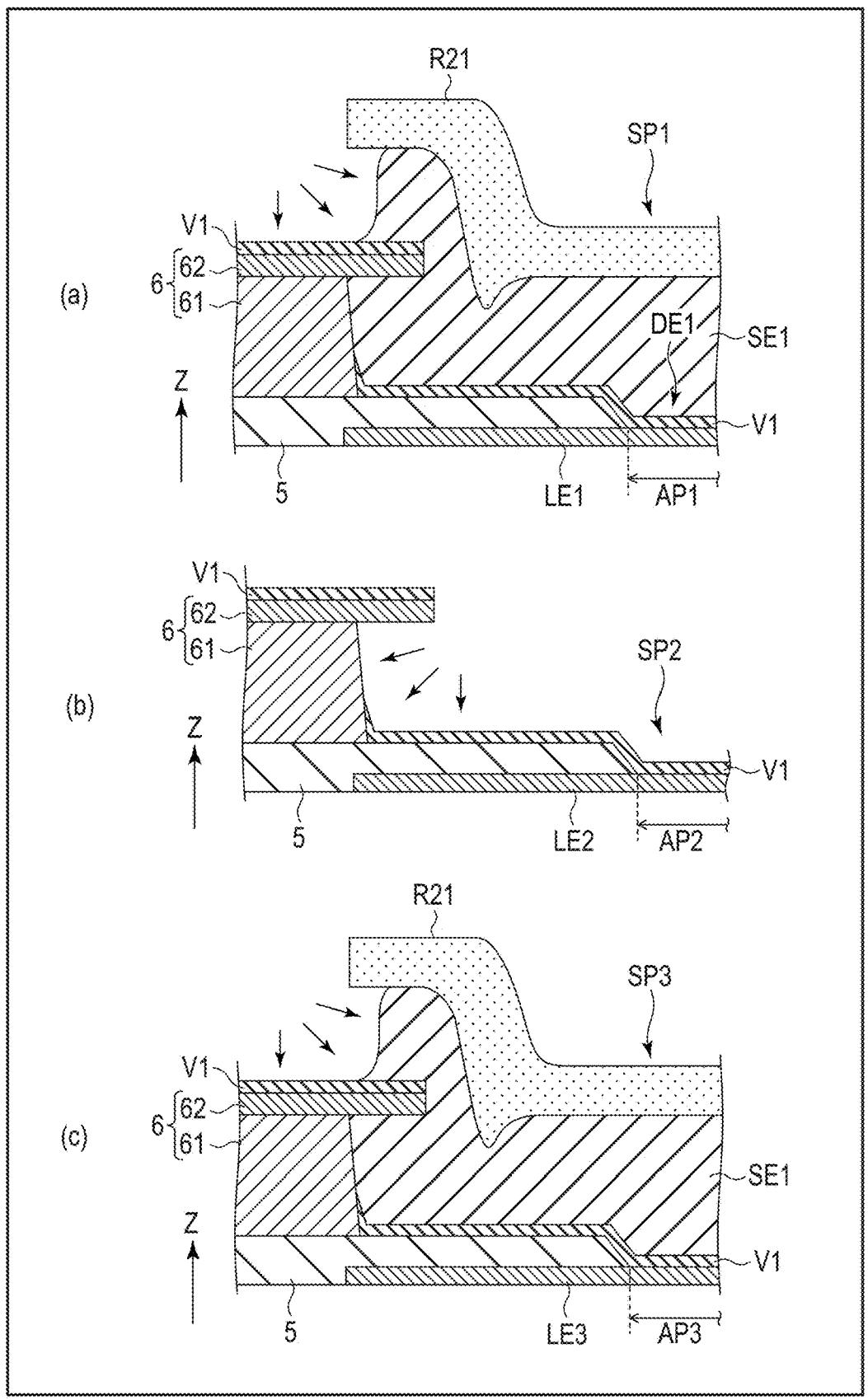
FIG. 23 is a schematic cross-sectional view showing the process subsequent to FIG. 22.

FIG. 23 shows how the first sealing layer SE1 is corroded by the anisotropic dry etching of process S4 and the isotropic dry etching of process S5. As shown in FIG. 23(a), near the first subpixel SP1, in a manner similar to that of the example of FIG. 10(a), of the first sealing layer SE1, the portion exposed from the resist R21 on the partition 6 is removed, and the first sealing layer SE1 located under the resist R21 is partly corroded. As shown in FIG. 23(c), near the third subpixel SP3, similarly, of the first sealing layer SE1, the portion exposed from the resist R21 on the partition 6 is removed, and the first sealing layer SE1 located under the resist R21 is partly corroded. To the contrary, as shown in FIG. 23(b), in the second subpixel SP2 and its vicinity, in a manner similar to the example of FIG. 10(b), the first sealing layer SE1 is entirely removed.

After process S5, etching is performed for the first vapor-deposited film V1 using the resist R21 as a mask (process S6). Further, the resist R21 is removed, and the residue is removed by asking (process S7).

The structures of the first and third subpixels SP1 and SP3 which underwent processes S6 and S7 and the vicinities of these subpixels are the same as the example of FIG. 11(a). The structure of the second subpixel SP2 which underwent processes S6 and S7 and its vicinity is the same as the example of FIG. 11(b).

After the first patterning process X21 described above, a process for forming the second display element DE2 is performed. Specifically, in a manner similar to that of processes Q13 and Q14 of the first embodiment, a second vapor-deposited film V2 and a second sealing layer SE2 are formed for the entire display area DA (processes S8 and S9).

Subsequently, a second patterning process X22 for, of the second sealing layer SE2 and the second vapor-deposited film V2, maintaining the portion located above the second lower electrode LE2 and removing the portion located above the first lower electrode LE1 and the third lower electrode LE3 is performed.

Figure 24:
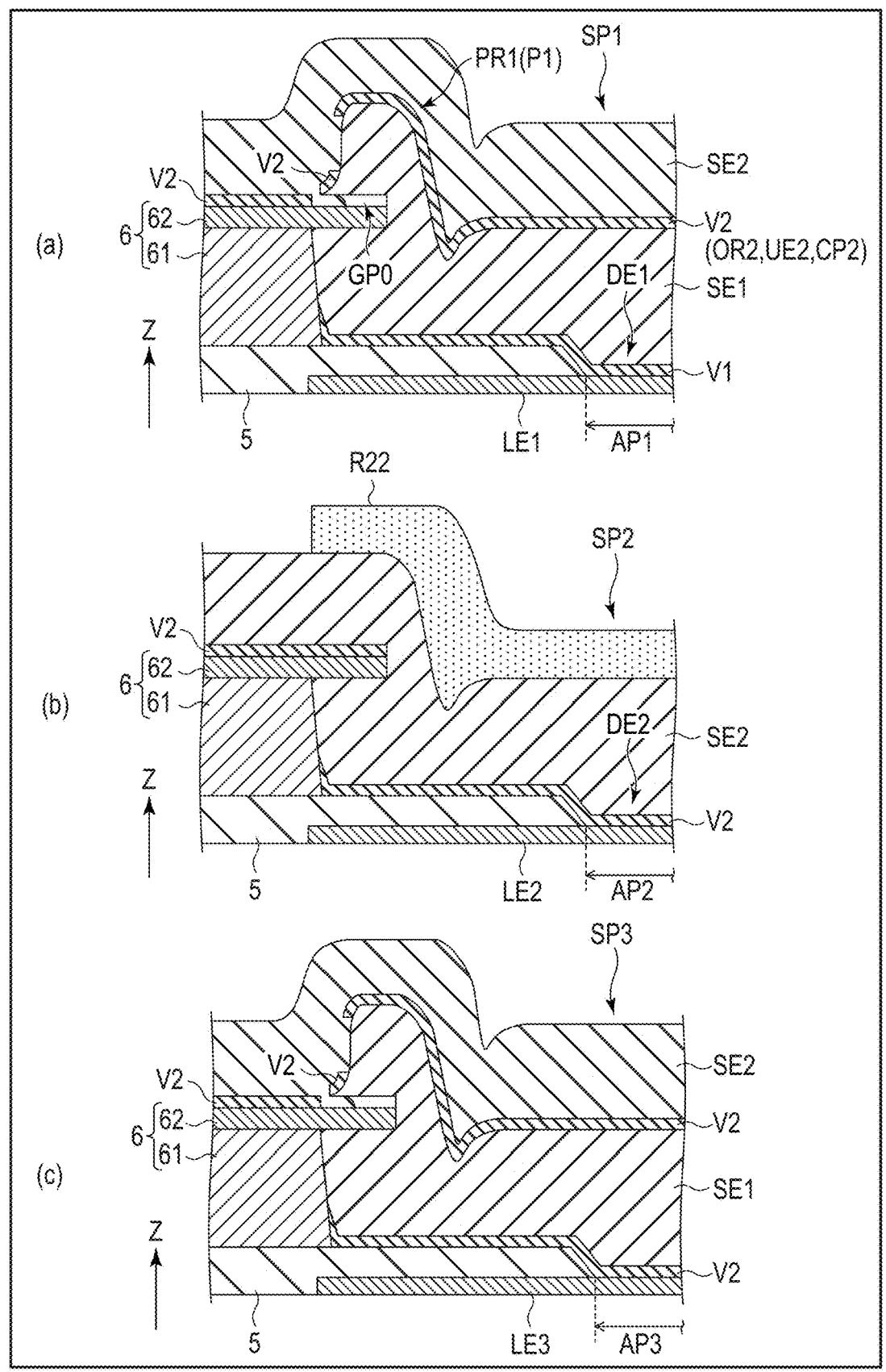
FIG. 24 is a schematic cross-sectional view showing the process subsequent to FIG. 23.

In the second patterning process X22, firstly, a resist R22 is formed on the second sealing layer SE2 (process S10). FIG. 24 shows the states of subpixels SP1, SP2 and SP3 which underwent process S10. As shown in FIG. 24(b), the resist R22 is provided above the second lower electrode LE2 and is not provided above the first lower electrode LE1 or the third lower electrode LE3. The resist R22 overlaps part of the partition 6 surrounding the second subpixel SP2 in the third direction Z. The structures of the first and third subpixels SP1 and SP3 shown in FIG. 24(a) and FIG. 24(c) and the vicinities of these subpixels are the same as the example of FIG. 12(a).

After process S10, anisotropic dry etching is performed for the second sealing layer SE2 using the resist R22 as a mask (process S11). In the present embodiment, the intensity of the anisotropic dry etching of process S11 is greater than that of the anisotropic dry etching of process S4. Specifically, the processing time of the anisotropic dry etching of process S11 is longer than that of the anisotropic dry etching of process S4. It should be noted that the second patterning process X22 does not include isotropic dry etching for the second sealing layer SE2.

Figure 25:
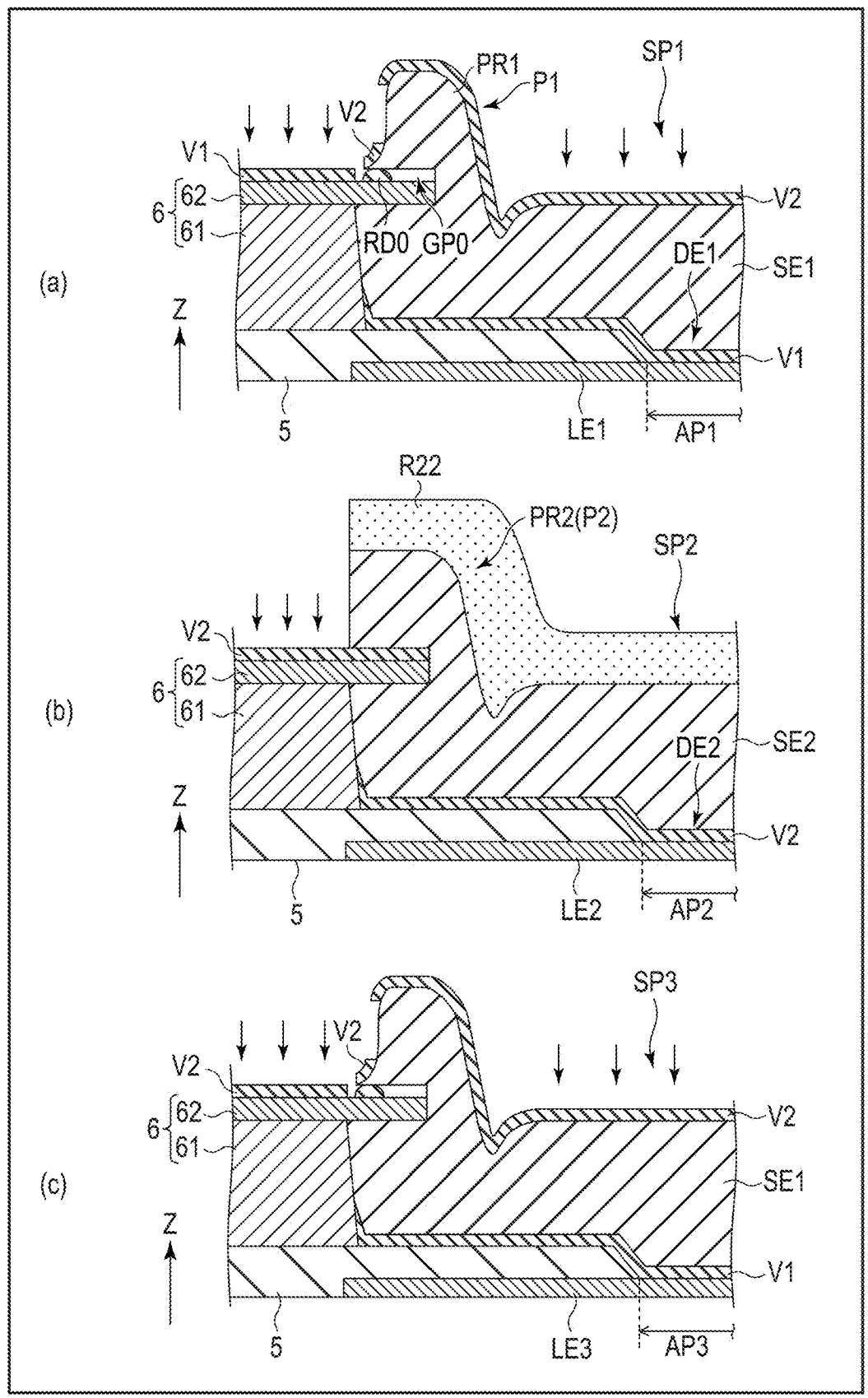
FIG. 25 is a schematic cross-sectional view showing the process subsequent to FIG. 24.

FIG. 25 shows how the second sealing layer SE2 is corroded by the anisotropic dry etching. As shown in FIG. 25(b), of the second sealing layer SE2, the portion exposed from the resist R22 on the partition 6 is removed near the second subpixel SP2. As shown in FIG. 25(a), the second sealing layer SE2 is removed as a whole in the first subpixel SP1 and its vicinity.

As shown in FIG. 25(a), near the entrance of the gap GP0, the second sealing layer SE2 partly remains, and the blocking portion RD0 shown in FIG. 20 is formed. The structure of the third subpixel SP3 and its vicinity shown in FIG. 25(c) is the same as the example of the first subpixel SP1 shown in FIG. 25(a).

After process S11, etching is performed for the second vapor-deposited film V2 using the resist R22 as a mask (process S12). Further, the resist R22 is removed, and the residue is removed by asking (process S13).

After the second patterning process X22 described above, a third patterning process X23 for, of the first sealing layer SE1 and the first vapor-deposited film V1, maintaining the portion located above the first lower electrode LE1 and removing the portion located above the third lower electrode LE3 is performed.

Figure 26:
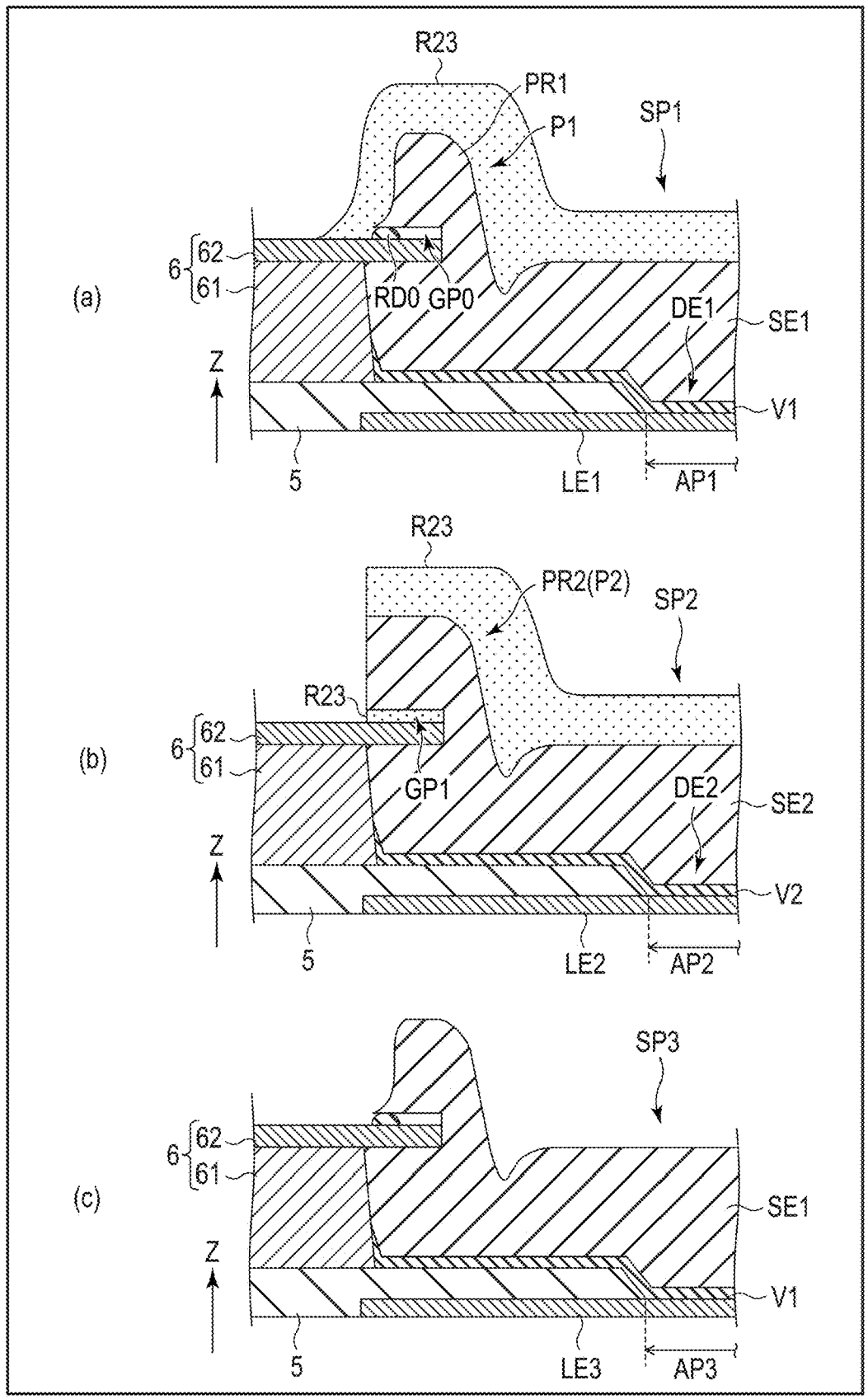
FIG. 26 is a schematic cross-sectional view showing the process subsequent to FIG. 25.

In the third patterning process X23, firstly, a resist R23 is formed (process S14). FIG. 26 shows the states of subpixels SP1, SP2 and SP3 which underwent process S14. The resist R23 is provided on the first sealing layer SE1 in the first subpixel SP1 as shown in FIG. 26(*a*) and is provided on the second sealing layer SE2 in the second subpixel SP2 as shown in FIG. 26(*b*). The resist R23 is not provided in the third subpixel SP3. In the example of FIG. 26(*b*), a gap GP1 is defined between a protrusion PR (a second portion P2) and an upper portion 62, and the gap GP1 is filled with the resist R23.

In the example of FIG. 26(*a*), a first portion P1 is covered with the resist R23 as a whole. In the example of FIG. 26(*b*), the side surface of the protrusion PR2 is exposed from the resist R23. As another example, the side surface of the protrusion PR2 may be covered with the resist R23.

It should be noted that the resist R23 shown in FIG. 26(*b*) may be the resist R22 which is left as it is. In this case, process S13 is omitted.

After process S14, anisotropic dry etching and isotropic dry etching are performed in order for the second sealing layer SE2 using the resist R23 as a mask (processes S15 and S16).

Figure 27:
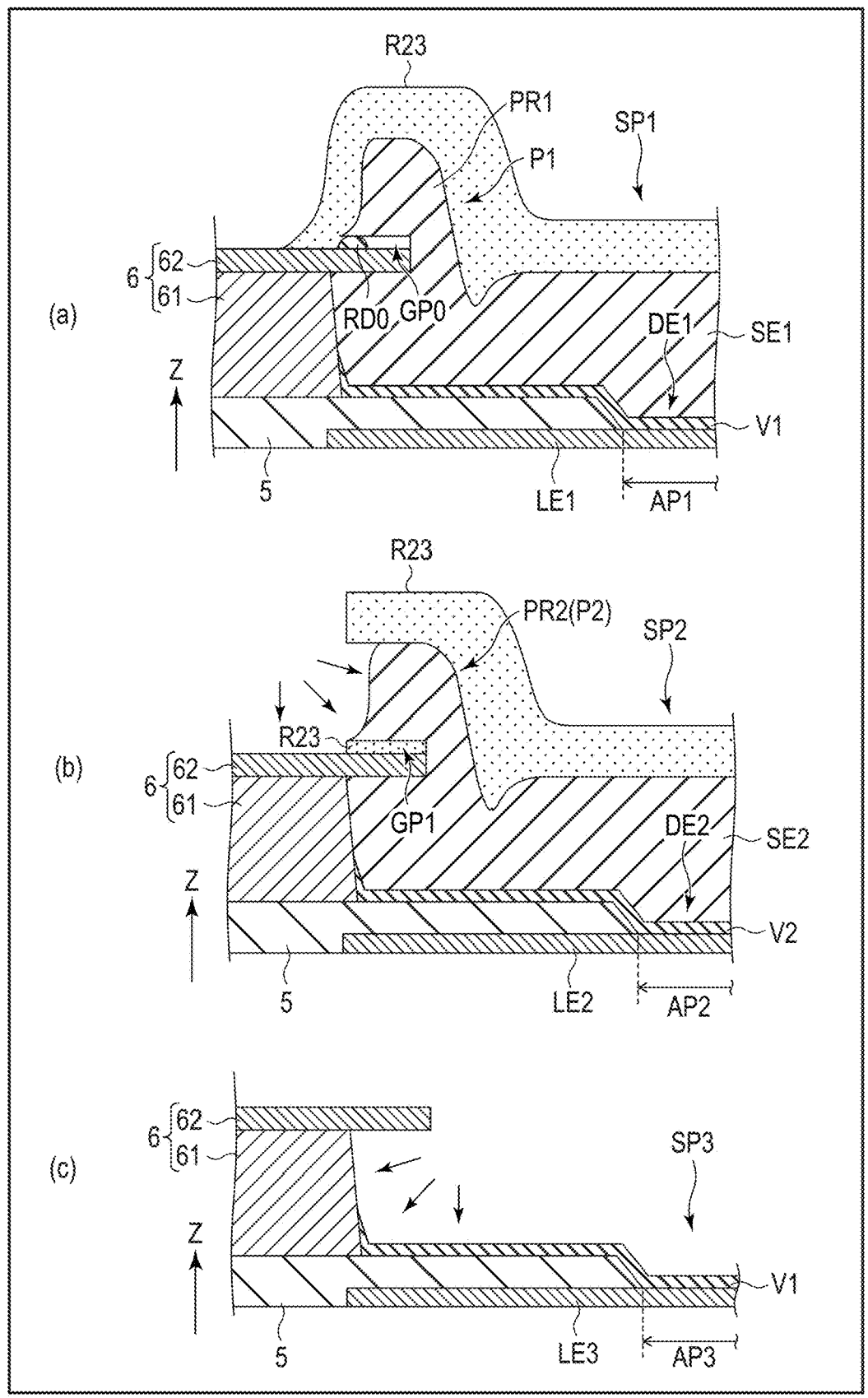
FIG. 27 is a schematic cross-sectional view showing the process subsequent to FIG. 26.

FIG. 27 shows how the first sealing layer SE1 is corroded by the anisotropic dry etching of process S15 and the isotropic dry etching of process S16. As shown in FIG. 27(*c*), the first sealing layer SE1 is entirely removed in the third subpixel SP3 and its vicinity. Further, as shown in FIG. 27(*b*), the second sealing layer SE2 located under the resist R23 is partly corroded near the second subpixel SP2.

After process S16, etching is performed for the first vapor-deposited film V1 using the resist R23 as a mask (process S17). By this process, the first vapor-deposited film V1 which remains in the third subpixel SP3 in FIG. 27(*c*) is removed. Further, the resist R23 is removed, and the residue is removed by asking (process S18).

After the third patterning process X23, a process for forming the third display element DE3 is performed. Specifically, in a manner similar to that of processes Q20 and Q21 of the first embodiment, a third vapor-deposited film V3 and a third sealing layer SE3 are formed for the entire display area DA (processes S19 and S20).

Subsequently, a fourth patterning process X24 for, of the third sealing layer SE3 and the third vapor-deposited film V3, maintaining the portion located above the third lower electrode LE3 and removing the portion located above the first lower electrode LE1 and the second lower electrode LE2 is performed.

Figure 28:
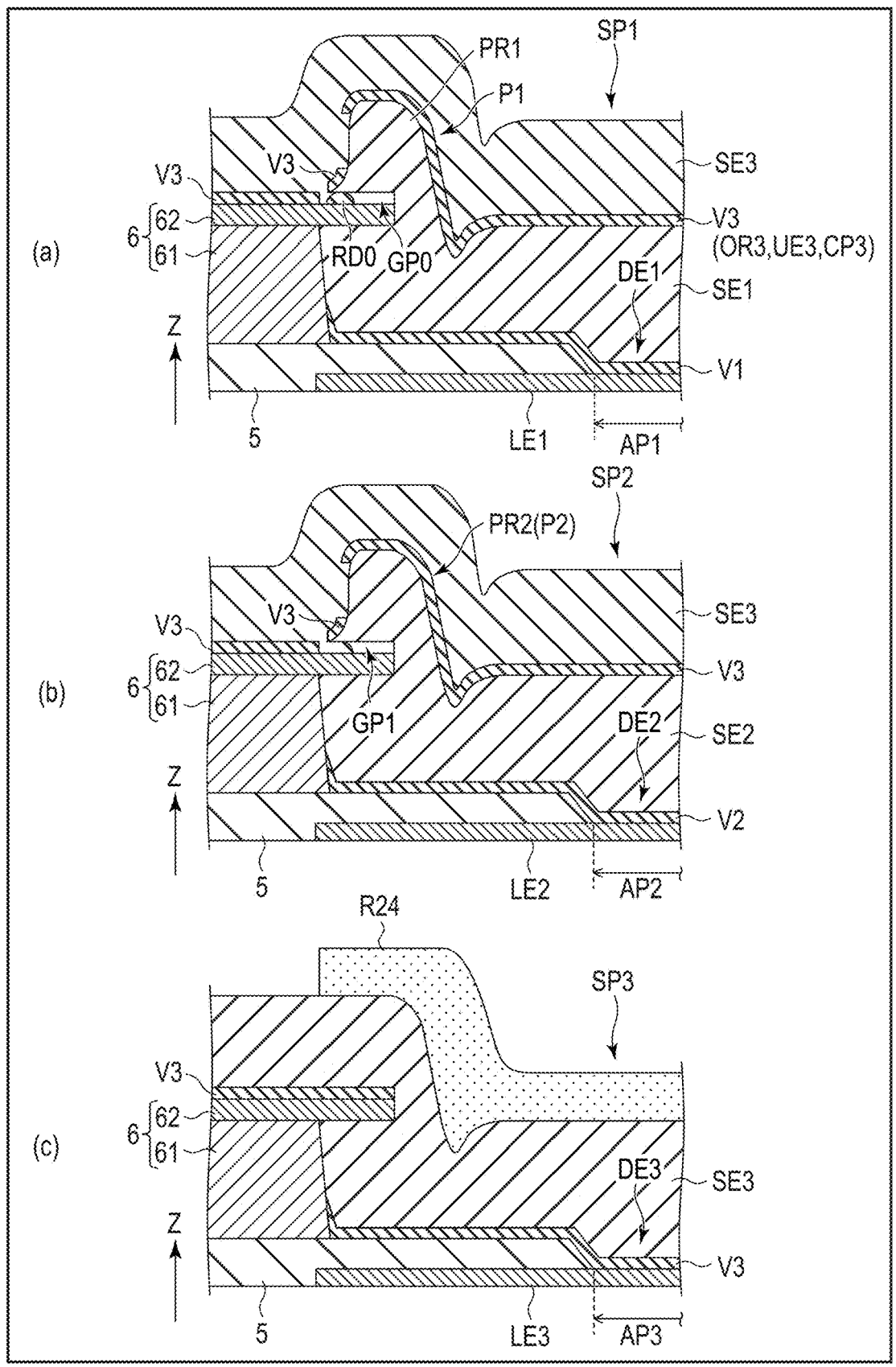
FIG. 28 is a schematic cross-sectional view showing the process subsequent to FIG. 27.

In the fourth patterning process X24, firstly, a resist R24 is formed as shown in FIG. 28 (process S21). The resist R24 is provided above the third lower electrode LE3 and is not provided above the first lower electrode LE1 or the second lower electrode LE2. As shown in FIG. 28(*c*), the resist R24 overlaps part of the partition 6 surrounding the third subpixel SP3 in the third direction Z.

Figure 29:
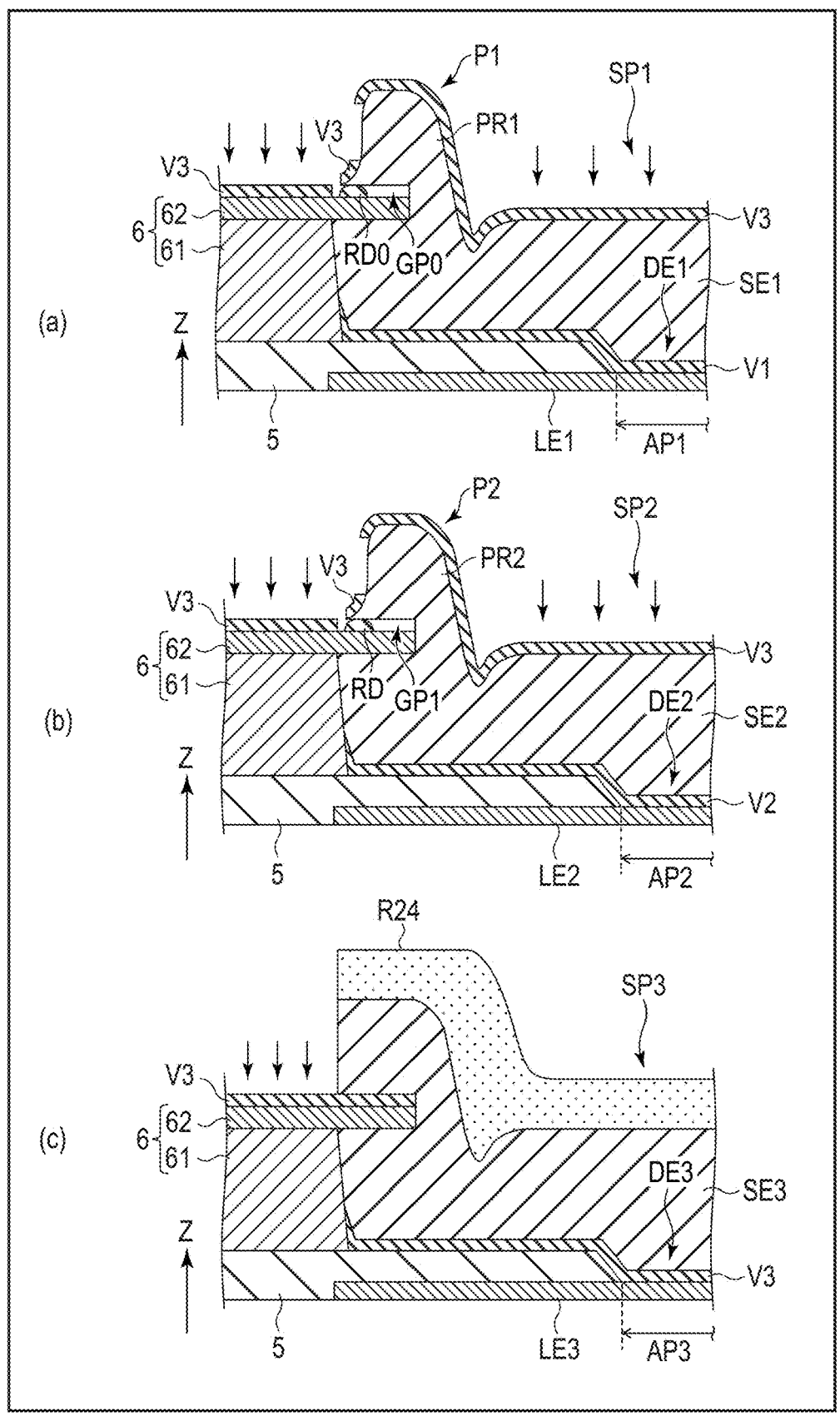
FIG. 29 is a schematic cross-sectional view showing the process subsequent to FIG. 28.

After process S21, anisotropic dry etching is performed for the third sealing layer SE3 in a manner similar to that of process Q23 of the first embodiment, using the resist R24 as a mask (process S22). The intensity of this anisotropic dry etching is greater than that of the anisotropic dry etching of processes S4 and S15. Specifically, the processing time of the anisotropic dry etching of process S22 is longer than that of the anisotropic dry etching of processes S4 and S15. FIG. 29 shows how the third sealing layer SE3 is corroded by the anisotropic dry etching of process S22. As shown in FIG. 29(*c*), of the third sealing layer SE3, the portion exposed from the resist R24 on the partition 6 is entirely removed near the third subpixel SP3. As shown in FIG. 29(*a*) and FIG. 29(*b*), the third sealing layer SE3 is removed as a whole in the first subpixel SP1 and the second subpixel SP2 and near these subpixels. As shown in FIG. 29(*b*), near the entrance of the gap GP1, the third sealing layer SE3 partly remains, and a blocking portion RD is formed.

The fourth patterning process X24 does not include isotropic dry etching. After process S22, etching is performed for the third vapor-deposited film V3 using the resist R24 as a mask (process S23). Further, the resist R24 is removed, and the residue is removed by asking (process S24).

FIG. 30 shows the states of subpixels SP1, SP2 and SP3 which underwent processes S23 and S24. In the example of FIG. 30(*c*), the third vapor-deposited film V3 located on the partition 6 surrounding the third subpixel SP3 is removed by the etching of process S23. Thus, a gap GP2 is defined between the upper portion 62 and, of the third sealing layer SE3, a third portion P3 which protrudes from the upper portion 62. As shown in FIG. 30(*a*) and FIG. 30(*b*), the third vapor-deposited film V3 is removed as a whole in subpixels SP1 and SP2.

After the display elements DE1, DE2 and DE3 and the sealing layers SE1, SE2 and SE3 which cover these display elements are formed in the above manner, the resin layer 13, the sealing layer 14 and the resin layer 15 are formed in order in a manner similar to that of processes Q26, Q27 and Q28 of the first embodiment. By this method, the display device DSP of the second embodiment can be obtained.

In the first embodiment, the rib 5 located in the third subpixel SP3 is subjected to the dry etching for the sealing layers SE1 and SE2 twice by processes Q10 and Q17. Therefore, if the rib 5 is formed of the same material as the sealing layers SE1, SE2 and SE3 or is formed of a material which is different from that of the sealing layers SE1, SE2 and SE3 but whose etching selective ratio to the sealing layers SE1, SE2 and SE3 is less, the rib 5 located in the third subpixel SP3 could be largely damaged through processes Q10 and Q17.

To the contrary, in the present embodiment, although the rib 5 located in the third subpixel SP3 is subjected to the dry etching for the first sealing layer SE1 in process S16, this rib 5 is not subjected to the dry etching for the second sealing layer SE2. By this configuration, the damage to the rib 5 can be reduced.

In the first embodiment, of the first sealing layer SE1 formed in the first subpixel SP1, the side surface of the portion located on the partition 6 is subjected to isotropic dry etching twice by processes Q10 and Q17. Thus, the first width W1 of the first portion P1 is made less.

To the contrary, in the manufacturing method of the present embodiment, of the first sealing layer SE1 formed in the first subpixel SP1, the side surface of the portion located on the partition 6 is subjected to isotropic dry etching by only one process S5. For this reason, as shown in FIG. 20, the first width W1 of the first portion P1 can be made great, thereby satisfactorily preventing moisture from permeating the first display element DE1. Various desirable effects can be obtained from the present embodiment in addition to the effects described here.

All of the display devices and manufacturing methods thereof that can be implemented by a person of ordinary skill in the art through arbitrary design changes to the display device and manufacturing method thereof described above as each embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

Examples of the display devices and manufacturing methods thereof recognized by the above embodiments are described below.

(1) A display device comprising:
a rib comprising a first pixel aperture, a second pixel aperture and a third pixel aperture;
a partition which includes a lower portion provided on the rib and an upper portion protruding from a side surface of the lower portion, and surrounds the first pixel aperture, the second pixel aperture and the third pixel aperture;
a first display element which includes a first lower electrode, a first upper electrode and a first organic layer provided between the first lower electrode and the first upper electrode, and overlaps the first pixel aperture;
a second display element which includes a second lower electrode, a second upper electrode and a second organic layer provided between the second lower electrode and the second upper electrode, and overlaps the second pixel aperture;
a third display element which includes a third lower electrode, a third upper electrode and a third organic layer provided between the third lower electrode and the third upper electrode, and overlaps the third pixel aperture;
a first sealing layer which covers the first display element and comprises a first portion located on the upper portion;
a second sealing layer which covers the second display element and comprises a second portion located on the upper portion; and
a third sealing layer which covers the third display element and comprises a third portion located on the upper portion, wherein
at least two of a first width of an area in which the first portion overlaps the upper portion, a second width of an area in which the second portion overlaps the upper portion and a third width of an area in which the third portion overlaps the upper portion are different from each other.

(2) The display device of the above (1), wherein the first width, the second width and the third width are different from each other.

(3) The display device of the above (1), wherein an area of the first pixel aperture is greater than an area of the third pixel aperture, and the first width is less than the third width.

(4) The display device of the above (3), wherein the area of the first pixel aperture is greater an area of the second pixel aperture,
the area of the third pixel aperture is less than the area of the second pixel aperture,
the first width is less than the second width, and
the third width is greater than the second width.

(5) The display device of the above (1), wherein the first organic layer emits blue light,
the second organic layer emits green light, and
the third organic layer emits red light.

(6) A display device comprising:
a rib comprising a first pixel aperture, a second pixel aperture and a third pixel aperture;
a partition which includes a lower portion provided on the rib and an upper portion protruding from a side surface of the lower portion, and surrounds the first pixel aperture, the second pixel aperture and the third pixel aperture;
a first display element which includes a first lower electrode, a first upper electrode and a first organic layer provided between the first lower electrode and the first upper electrode, and overlaps the first pixel aperture;
a second display element which includes a second lower electrode, a second upper electrode and a second organic layer provided between the second lower electrode and the second upper electrode, and overlaps the second pixel aperture;
a third display element which includes a third lower electrode, a third upper electrode and a third organic layer provided between the third lower electrode and the third upper electrode, and overlaps the third pixel aperture;
a first sealing layer which covers the first display element and comprises a first portion located on the upper portion;
a second sealing layer which covers the second display element and comprises a second portion located on the upper portion; and
a third sealing layer which covers the third display element and comprises a third portion located on the upper portion, wherein
a gap closed by the second portion and the upper portion is defined between the second portion and the upper portion.

(7) The display device of the above (6), wherein the first portion is in contact with the upper portion.

(8) The display device of the above (6), wherein an open gap is defined between the third portion and the upper portion.

(9) The display device of the above (6), wherein the first organic layer emits blue light,
the second organic layer emits green light, and
the third organic layer emits red light.

(10) A manufacturing method of a display device, the method comprising:
forming a first lower electrode, a second lower electrode and a third lower electrode;
forming a rib comprising a first pixel aperture overlapping the first lower electrode, a second pixel aperture overlapping the second lower electrode, and a third pixel aperture overlapping the third lower electrode;
forming a partition which includes a lower portion provided on the rib and an upper portion protruding from a side surface of the lower portion, and surrounds the first pixel aperture, the second pixel aperture and the third pixel aperture;

forming a first vapor-deposited film including a first organic layer which is in contact with the first lower electrode through the first pixel aperture and a first upper electrode which covers the first organic layer in an entire display area;

forming a first sealing layer which covers the first vapor-deposited film in the entire display area;

performing a first patterning process for, of the first sealing layer and the first vapor-deposited film, maintaining a portion located above the first lower electrode and removing a portion located above the second lower electrode and the third lower electrode;

forming a second vapor-deposited film including a second organic layer which is in contact with the second lower electrode through the second pixel aperture and a second upper electrode which covers the second organic layer in the entire display area;

forming a second sealing layer which covers the second vapor-deposited film in the entire display area;

performing a second patterning process for, of the second sealing layer and the second vapor-deposited film, maintaining a portion located above the second lower electrode and removing a portion located above the first lower electrode and the third lower electrode;

forming a third vapor-deposited film including a third organic layer which is in contact with the third lower electrode through the third pixel aperture and a third upper electrode which covers the third organic layer in the entire display area;

forming a third sealing layer which covers the third vapor-deposited film in the entire display area; and performing a third patterning process for, of the third sealing layer and the third vapor-deposited film, maintaining a portion located above the third lower electrode and removing a portion located above the first lower electrode and the second lower electrode, wherein the first patterning process includes anisotropic dry etching for the first sealing layer, and isotropic dry etching performed for the first sealing layer after the anisotropic dry etching, and the third patterning process includes anisotropic dry etching for the third sealing layer and does not include isotropic dry etching for the third sealing layer.

(11) The manufacturing method of the above (10), wherein the second patterning process includes anisotropic dry etching for the second sealing layer and isotropic dry etching performed for the second sealing layer after the anisotropic dry etching.

(12) The manufacturing method of the above (10), wherein a processing time of the anisotropic dry etching in the third patterning process is longer than a processing time of the anisotropic dry etching in the first patterning process.

(13) A manufacturing method of a display device, the method comprising:

forming a first lower electrode, a second lower electrode and a third lower electrode;

forming a rib comprising a first pixel aperture overlapping the first lower electrode, a second pixel aperture overlapping the second lower electrode and a third pixel aperture overlapping the third lower electrode;

forming a partition which includes a lower portion provided on the rib and an upper portion protruding from a side surface of the lower portion, and surrounds the first pixel aperture, the second pixel aperture and the third pixel aperture;

forming a first vapor-deposited film including a first organic layer which is in contact with the first lower electrode through the first pixel aperture and a first upper electrode which covers the first organic layer in an entire display area;

forming a first sealing layer which covers the first vapor-deposited film in the entire display area;

performing a first patterning process for, of the first sealing layer and the first vapor-deposited film, maintaining a portion located above the first lower electrode and the third lower electrode and removing a portion located above the second lower electrode;

forming a second vapor-deposited film including a second organic layer which is in contact with the second lower electrode through the second pixel aperture and a second upper electrode which covers the second organic layer in the entire display area;

forming a second sealing layer which covers the second vapor-deposited film in the entire display area;

performing a second patterning process for, of the second sealing layer and the second vapor-deposited film, maintaining a portion located above the second lower electrode and removing a portion located above the first lower electrode and the third lower electrode;

performing a third patterning process for, of the first sealing layer and the first vapor-deposited film, maintaining a portion located above the first lower electrode and removing a portion located above the third lower electrode after the second patterning process;

forming a third vapor-deposited film including a third organic layer which is in contact with the third lower electrode through the third pixel aperture and a third upper electrode which covers the third organic layer in the entire display area;

forming a third sealing layer which covers the third vapor-deposited film in the entire display area; and forming a fourth patterning process for, of the third sealing layer and the third vapor-deposited film, maintaining a portion located above the third lower electrode and removing a portion located above the first lower electrode and the second lower electrode, wherein the first patterning process includes anisotropic dry etching for the first sealing layer and isotropic dry etching performed for the first sealing layer after the anisotropic dry etching, and the fourth patterning process includes anisotropic dry etching for the third sealing layer and does not include isotropic dry etching for the third sealing layer.

(14) The manufacturing method of the above (13), wherein the second patterning process includes anisotropic dry etching for the second sealing layer and does not include isotropic dry etching for the second sealing layer.

(15) The manufacturing method of the above (14), wherein a processing time of the anisotropic dry etching in the second patterning process is longer than a processing time of the anisotropic dry etching in the first patterning process.

(16) The manufacturing method of the above (13), wherein
the third patterning process includes anisotropic dry etching for the first sealing layer and isotropic dry etching performed for the first sealing layer after the anisotropic dry etching.

(17) The manufacturing method of the above (13), wherein
a processing time of the anisotropic dry etching in the fourth patterning process is longer than a processing time of the anisotropic dry etching in the first patterning process.

What is claimed is:

1. A display device comprising:
a rib comprising a first pixel aperture, a second pixel aperture and a third pixel aperture;
a partition which includes a lower portion provided on the rib and an upper portion protruding from a side surface of the lower portion, and surrounds the first pixel aperture, the second pixel aperture and the third pixel aperture;
a first display element which includes a first lower electrode, a first upper electrode and a first organic layer provided between the first lower electrode and the first upper electrode, and overlaps the first pixel aperture;
a second display element which includes a second lower electrode, a second upper electrode and a second organic layer provided between the second lower electrode and the second upper electrode, and overlaps the second pixel aperture;
a third display element which includes a third lower electrode, a third upper electrode and a third organic layer provided between the third lower electrode and the third upper electrode, and overlaps the third pixel aperture;
a first sealing layer which covers the first display element and comprises a first portion located on the upper portion;
a second sealing layer which covers the second display element and comprises a second portion located on the upper portion; and
a third sealing layer which covers the third display element and comprises a third portion located on the upper portion, wherein
at least two of a first width of an area in which the first portion overlaps the upper portion, a second width of an area in which the second portion overlaps the upper portion and a third width of an area in which the third portion overlaps the upper portion are different from each other.

2. The display device of claim 1, wherein
the first width, the second width and the third width are different from each other.

3. The display device of claim 1, wherein
an area of the first pixel aperture is greater than an area of the third pixel aperture, and
the first width is less than the third width.

4. The display device of claim 3, wherein
the area of the first pixel aperture is greater than an area of the second pixel aperture,
the area of the third pixel aperture is less than the area of the second pixel aperture,
the first width is less than the second width, and
the third width is greater than the second width.

5. The display device of claim 1, wherein
the first organic layer emits blue light,
the second organic layer emits green light, and
the third organic layer emits red light.

* * * * *